United States Patent [19]

Jenkin

[11] Patent Number: 4,721,958
[45] Date of Patent: Jan. 26, 1988

[54] REAL-TIME PULSE PROCESSOR

[75] Inventor: Keith R. Jenkin, San Marcos, Calif.

[73] Assignee: TRW Inc., Redondo Beach, Calif.

[21] Appl. No.: 790,699

[22] Filed: Oct. 23, 1985

[51] Int. Cl.$^4$ .......................... G01S 7/44; H03K 5/26
[52] U.S. Cl. ..................................... 342/13; 328/119; 377/54; 364/517
[58] Field of Search ............... 342/13, 20, 192, 195; 307/518, 524; 328/108, 109, 110, 139, 140, 119; 375/94; 364/517, 528; 324/78 F, 78 R; 382/16, 17, 36, 37, 38; 377/54, 50; 370/112

[56] References Cited

U.S. PATENT DOCUMENTS

| | | | |
|---|---|---|---|
| 3,518,555 | 6/1970 | Konotchick, Jr. | 307/518 X |
| 3,546,599 | 12/1970 | Konotchick, Jr. | 307/518 X |
| 3,718,929 | 2/1973 | Van Horn | 342/192 X |
| 3,743,948 | 7/1973 | Dahlin et al. | 328/119 |
| 3,851,261 | 11/1974 | Geiger | 328/119 X |
| 3,922,676 | 11/1975 | O'Berry et al. | 342/13 |
| 3,940,768 | 2/1976 | Olsen et al. | 342/13 |
| 3,999,136 | 12/1976 | O'Berry et al. | 328/140 X |
| 4,109,197 | 8/1978 | Lang, Jr. et al. | 342/13 X |
| 4,209,835 | 6/1980 | Guadagnolo | 342/13 X |
| 4,303,921 | 12/1981 | Fitzgerald et al. | 342/13 |

FOREIGN PATENT DOCUMENTS 901428 7/1962 United Kingdom ................ 342/192

Primary Examiner—T. H. Tubbesing
Assistant Examiner—Gilberto Barrón, Jr.
Attorney, Agent, or Firm—Peter J. Michaelson; Robert J. Stern

[57] ABSTRACT

Apparatus, which first de-interleaves a signal, that comprises a plurality of interleaved pulse trains, into its constituent pulse trains and then identifies the emitter which transmitted each pulse train, is described herein. Specifically, this apparatus comprises a folded shift register which performs the de-interleaving. The folded shift register comprises a plurality of serially connected identical "active" cells, each of which detects a pulse occurring at a particular group pulse repetition interval (PRI) and, in an embodiment described herein, ascertains the inter-pulse PRI for each detected pulse for use in identifying an emitter. One or more processors analyze the group and inter-pulse PRI data, provided by the folded shift register, in order to identify each emitter.

53 Claims, 18 Drawing Figures

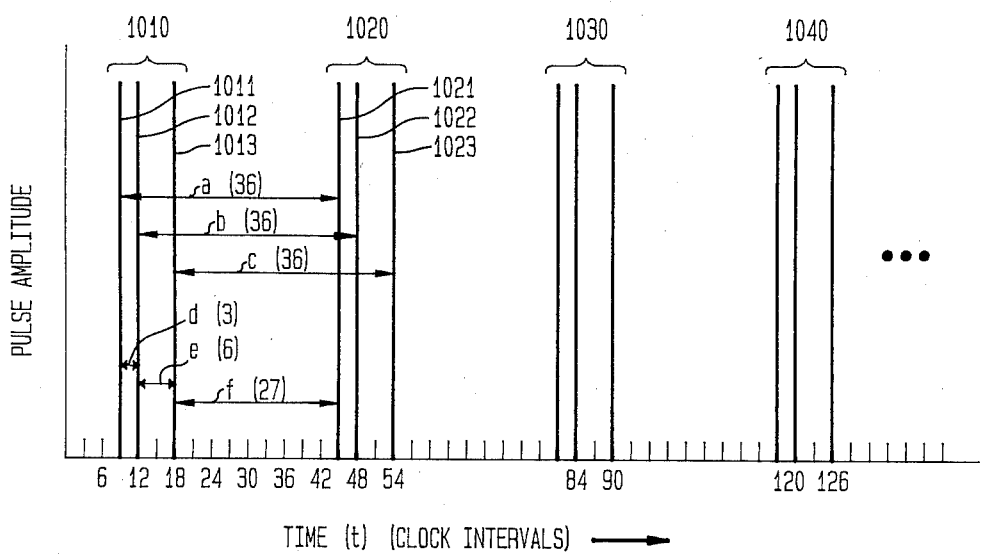
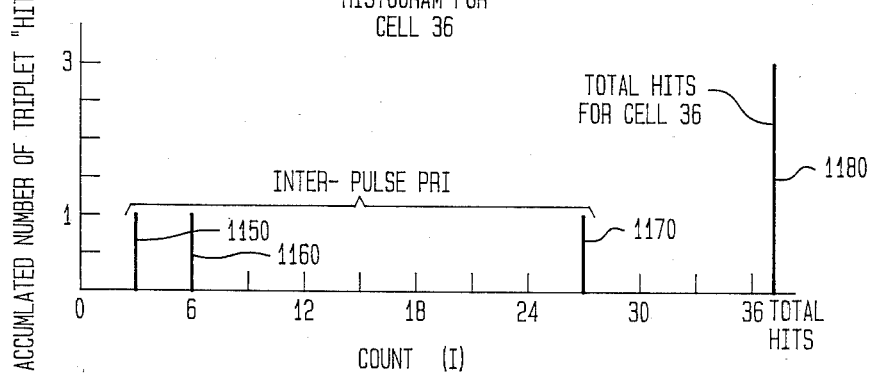

HISTOGRAM FOR CELL 319

STABLE EMITTER
(PRI=319)

HISTOGRAM FOR CELL 126

TWO LEGGED STAGGERED EMITTER
(GROUP PRI=126)

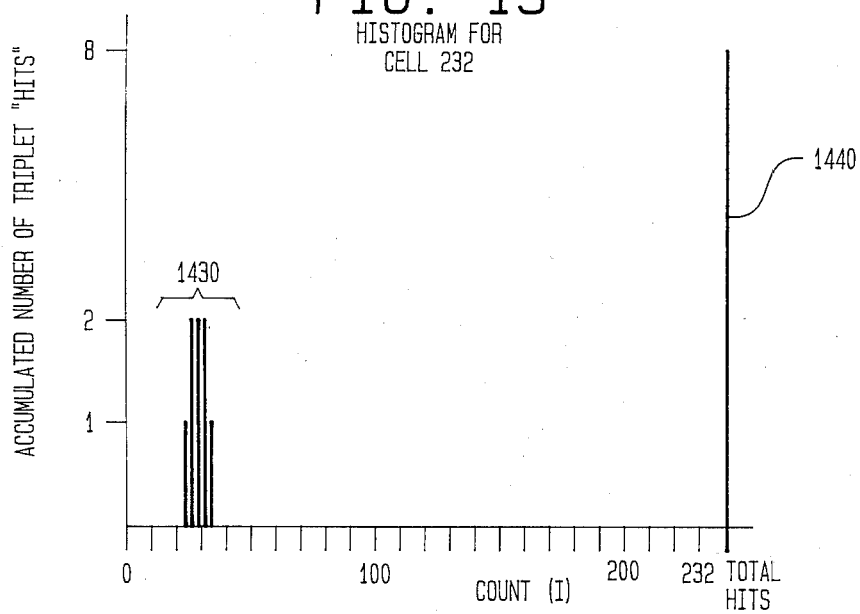
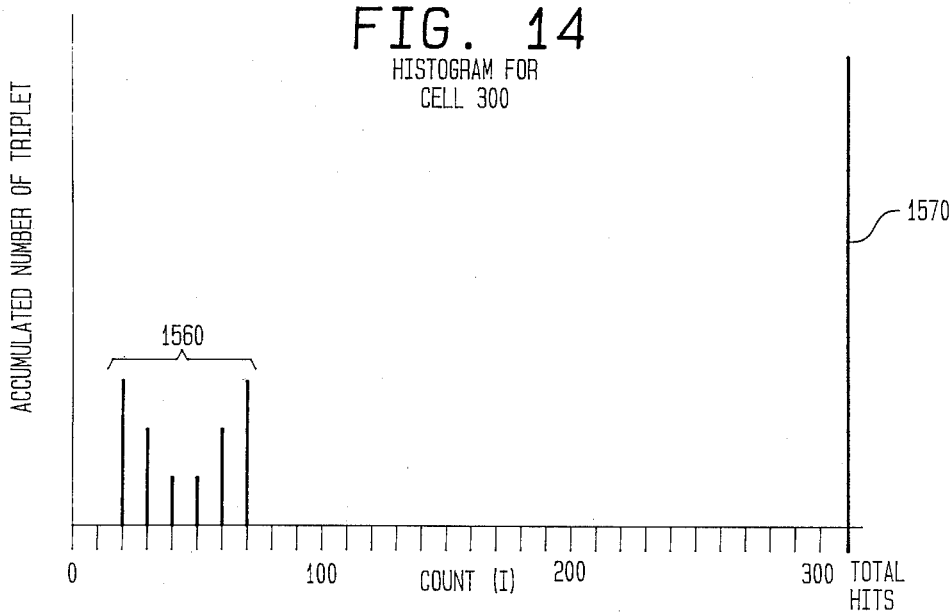

REAL-TIME PULSE PROCESSOR

BACKGROUND OF THE INVENTION

1. Field of the Invention

The invention relates to apparatus which processes an input signal, that comprises a plurality of interleaved pulse trains, in order to unambiguously de-interleave the individual pulse trains that together constitute that signal and to uniquely identify the emitter which transmitted each pulse train.

2. Description of the Prior Art

Continuously operating radar systems have seen increasing use in recent years. So much so, that currently the electrical environment surrounding many geographic areas—particularly those having significant population concentrations and/or those having some strategic importance—generally contain pulsed signals emanating from perhaps as many as 50 to 100 or more separate sources (emitters). The pulsed signals transmitted from these emitters add, at the output of a wideband detector in a receiver, to form a composite signal which may, today, possess a pulse rate of 1 million pulses/second. As the use of radar systems increases, this pulse rate is expected to increase at least ten fold over the next few years.

Often, particular pulsed signals existing within an environment must be identified so that one radar emitter can be distinguished from another.

Individual pulsed signals which comprise any composite signal are usually identified by a pulsed emitter identification system which contains a pulse analysis system. The pulse analysis system de-interleaves the composite signal into its constituent pulse trains. Unfortunately, pulse analysis systems known to the art possess serious drawbacks.

For example, many prior art pulse analysis systems disadvantageously expend considerable time in de-interleaving the composite signal into its constituent pulse trains and are thus unsuitable for real-time use. Specifically, in these systems, all the pulses comprising the composite signal are first sampled for a pre-defined sampling period, generally ranging from 100 milliseconds to 1 second, in order to collect a known amount of input data. Concurrently therewith, time of arrival (TOA) data for each pulse is determined and stored in a memory for subsequent processing. Once all these operations have been completed, the TOA data for every sampled pulse is subsequently analyzed, by a computer, to discern any repetitive pattern existing in the data. Each pattern identifies a particular emitter. Unfortunately, few, if any, of these patterns are known ahead of time. Moreover, these patterns often contain undesireable components occurring at the harmonics of each constituent emitter. To eliminate any ambiguities caused by harmonics, all these harmonics must be detected and then removed from the discerned pattern prior to any further analysis. Consequently, pattern detection based on the TOA data requires rather sophisticated analysis algorithms which consume an excessive amount of processing time and, as such, can not generally be undertaken in real-time.

In particular, owing to the complexity of the analysis algorithms, these pulse analysis systems known to the art usually can not complete the processing of all the TOA data during a sampling period, and hence are unable to keep up with the input data. As a result, sampling can not be resumed until the processing has been completed, and, hence, usually results in a gap, occurring between successive sampling periods, during which no input data is sampled. Even if two or more identical analysis systems were to be used in an alternating fashion to avoid such a gap, a discontinuity would likely be created in the data between each sampled section. This gap or discontinuity is usually of no consequence whenever continuous emitters are being received. However, such a gap or discontinuity can result in the total loss of detection of an emitter which is received for only a short period of time, either because that emitter is a "short-on-time" emitter, as discussed below, and/or due to the scan geometry associated with that emitter and the receiving antenna. Moreover, as the pulse rate of the composite signal increases—as it is expected to do during the coming years, these prior art systems will not be able to "keep pace" with the increasing pulse rate and will thereby lose increasingly larger amounts of input data. Hence, the future ability of these prior art systems to both de-interleave the constituent pulse trains and to accurately identify emitters, particularly "exotic" emitters, will markedly decrease.

In order to reduce the processing needed to detect a pulse train existing within the composite signal and identify its associated emitter, the art teaches that various characteristics, i.e. the electrical "signature", of each previously identified emitter, and in particular the characteristics of its associated pulse train (e.g. its pulse repetition interval—PRI, whether that PRI varies and the magnitude of any such variation) can be stored in an "emitter file." With this information, data which describes each received pulse, collectively referred to as pulse descriptor data, is compared with each entry in the emitter file in an effort to quickly classify a pulse train and identify its associated emitter based upon its electical signature. This technique saves considerable time in identifying known emitters.

Unfortunately, some radar emitters intentionally change their characteristics over a wide range and often within a short period of time to avoid their detection by pulse analysis equipment. Such emitters are often referred to as "exotic" emitters. Illustrative types of such emitters, grouped in terms of increasing complexity, include: staggered emitters—i.e. those emitters which simultaneously and continuously generate a pulse train that has a pulse repetition interval that alternates between two values; multi-legged staggered emitters, i.e. those emitters which continuously generate a repetitive sequence of pulses each having a different PRI; wobulated emitters, i.e. those emitters which continuously produce pulses that have a PRI that varies in accordance with a continuous time dependant function, such as a sinusoid or a sawtooth; and various combinations of these types.

Furthermore, whenever a doppler radar emitter appears in any environment, its pulse train usually dominates the environment to the point of obscuring pulse trains produced by other emitters. This occurs because a doppler emitter continuously produces pulses having a very short fixed PRI. Since a doppler emitter produces a substantial number of pulses, these pulses are extremely difficult to filter out of the composite signal. For that reason, prior art pulse detection systems do not perform this filtering and hence experience difficulty in detecting non-doppler pulse trains which simultaneously appear with a doppler pulse train. This difficulty worsens considerably whenever two or more doppler emitters simultaneously transmit pulses into the same environment.

In addition, many exotic emitters utilize a "short-on-time". Short-on-time type radar emitters only produce a burst of pulses during a very short interval of time and then remain inactive (quiet) for a long interval of time. The number of pulses comprising any such burst is often small, generally ranging between 7 to 10. In fact, during any such burst, a short-on-time radar emitter will transmit just the minimum number of pulses necessary to obtain accurate distance information. Since short-on-time radars emit very few pulses per burst, these radars are extremely difficult to detect. Similar performance can also occur whenever a narrow beam search radar momentarily sweeps over the receiving antenna of the pulse analysis system.

Moreover, to further complicate pulse train detection and emitter identification, the composite signal often contains pulsed signals that have jittered pulse intervals, missing pulses and/or general background noise pulses.

Since the manner in which an exotic emitter changes and the amount of its change are generally unknown to any emitter identification system, comparing TOA and/or other pulse descriptor data against entries in an "emitter file" often provides erroneous results and thus can not be relied upon. Hence, few, if any, a priori assumptions can be made, based upon previously detected patterns, to accurately predict future performance of an exotic emitter. Moreover, a pulse analysis technique which detects pulse trains having a constant PRI can not be used to detect pulse trains emanating from exotic emitters. Consequently, to accurately identify the pulse trains from exotic emitters, all the TOA data has to be continuously analyzed using highly sophisticated pattern recognition algorithms to discern any repetitive patterns existant therein. No processing time can be saved by relying upon previously detected patterns. Thus, emitter identification systems known to the art require a substantial amount of processing time to detect a pulse train emanating from an exotic emitter. Furthermore, as the number, pulse rate and/or complexity of constituent pulse trains comprising any composite signal increases, the pattern recognition algorithms must be modified in order for them to handle these pulse trains. These modifications usually entail increasing the sophistication of these algorithms which, in turn, renders them much too slow to execute in real-time.

In addition, many radar emitters transmit pulses using a spread-spectrum technique, whereby the carrier frequency of a pulse stream varies, often widely, with time. With such a technique, one pulse in the stream is transmitted on one carrier frequency while the next pulse may be transmitted on a markedly different carrier frequency. Pulse analysis systems known to the art have generally utilized a channelized approach in analyzing spread spectrum pulse streams. Here, a wide spectral band is broken into separate frequency ranges. Each frequency range is analyzed by a different processor in order to identify its constituent pulse trains. Such an approach reduces the total number of pulses that need to be analyzed by each processor to those pulses which exist in the corresponding channel associated with that processor. Difficulties arise with channelized pulse analysis systems inasmuch as the separate pulses belonging to a spread spectrum pulse train often reside in different frequency ranges, and each frequency range is generally analyzed independently of any other frequency range. The results for one frequency range are not combined with the results for any other range to determine the existence of a spread-spectrum signal that extends over multiple frequency ranges. Thus, channelized pulse analysis systems are often unable to detect and identify spread-spectrum pulse trains.

Moreoever, pulse analysis systems known to the art have poor immunity to spurious noise pulses and hence possess a rather high noise floor. As such, these systems are often unable to detect fairly weak pulsed signals, particularly those which contain missing pulses.

For these reasons, known pulsed emitter identification systems are generally unsuitable for use in many applications.

Hence, a need exists in the art for apparatus which can unambiguously de-interleave a composite signal, comprising a substantial number of interleaved pulse trains produced by stable and/or exotic emitters of any type and complexity, into its constituent pulse trains in real-time and which can uniquely identify the emitter which transmitted each pulse train without the need to make any a priori assumptions about the characteristics of any such emitter.

SUMMARY OF THE INVENTION

Accordingly, it is an object of the present invention to provide apparatus which can detect in real-time and identify individual radar emitters, that produce pulse trains that comprise an electrical environment.

A particular object is to provide apparatus which in real-time can de-interleave a composite signal having a very high pulse rate without losing any data.

Another particular object is to detect both simple and exotic emitters.

Another particular object is to identify the type of each detected emitter without the need to make any a priori assumptions about the characteristics of that emitter.

A more particular object is to determine the group pulse repetition interval (PRI) of each detected pulse train transmitted by either a stable or an exotic emitter and the the manner in which the inter-pulse PRI changes for an exotic emitter, all in real-time.

Another particular object is to accurately detect a non-doppler emitter which exists in an environment simultaneously with a doppler emitter.

Another particular object is to accurately detect short-on-time emitters, particularly those which transmit very few pulses during any one burst.

Another object is to provide apparatus which can de-interleave a composite signal, comprising a substantial number of interleaved pulse trains produced by stable and/or exotic emitters of any type and complexity, into its constituent pulse trains, in real-time, and which can identify the individual emitters responsible therefor.

Another object is to detect and identify spread spectrum pulse trains.

Another object is to provide a system having a low noise floor to detect and identify relatively weak pulsed signals appearing in an electrical environment.

These and other objects are accomplished, in accordance with the teachings of the present invention, by an emitter identification system which comprises: a de-interleaving circuit, responsive to an input signal, for determining the pulse repetition interval of each input pulse appearing in the input signal, and for routing each of the input pulses to a respective one of a plurality of output leads, wherein each of the outputs corresponds to a different group pulse repetition interval; and an identifying circuit, connected to the output leads, for separately analyzing the input pulses appearing on at least one of the output leads in order to discern any repetitive pattern existant therein and thereby partially identify the emitter which corresponds to the input pulses appearing on that one output.

In particular, the inventive pulse analysis system first de-interleaves the composite signal into its constituent group pulse trains and, for each of these pulse trains, generates a histogram depicting the temporal components of that train. Then, this system analyzes each temporal histogram using pattern recognition algorithms. Since the temporal histogram of each constitent pulse train is far simpler than the signature of the entire composite signal, relatively simple pattern recognition algorithms can be used to perform this analysis. Moreover, since each temporal histogram corresponds to only one group PRI (GPRI), pattern recognition can be undertaken substantially in parallel for each different GPRI. This saves considerable processing time over prior art systems and readily permits the inventive system to be used in real-time applications.

Prior art systems, by contrast, analyze the signature of the entire composite signal in order to determine whether it contains the signature of any known radar emitter, rather than separately analyzing each de-interleaved pulse train and particularly its histogram. If a match is found, then the processor in these prior art systems extracts this known signature from the signature of the composite signal. The comparison and extraction steps are then iteratively repeated until the signature of each pulse train existing in the composite signal has been extracted therefrom. Because pattern recognition is performed on the entire composite signal (which may contain 50–100 or more separate interleaved pulse trains), this processing tends to be exceedingly complex and highly time consuming. Since this processing is generally perfomed sequentially, insufficient processing time is often available to permit these prior art emitter identification systems to operate in real-time. time.

Since all radar emitters possess a constant GPRI, the inventive system de-interleaves a composite signal into its constitutent pulse trains based upon the GPRI of each pulse comprising that signal. Specifically, the de-interleaving circuit is a folded shift register which contains n cells. A fraction of these cells (numbering "m" cells) are simple shift elements (hereinafter referred to as "shift" cells), and each of the remaining n-m cells (hereinafter referred to as "active" cells) detects a pulse occurring at a particular GPRI. In an exemplary embodiment discussed hereinbelow, the folded shift register may comprise 320 cells (numbered 0 to 319, i.e. n=319), of which the first 32 cells are "shift" cells and the remaining 287 are "active" cells. To accomplish GPRI detection, each "active" cell, at a minimum, determines whether a group, having a certain number of pulses (three in certain embodiments, four or more in others) spaced apart by a pre-defined GPRI, occurs in the composite signal. If such a group of pulses occurs, then the "active" cell which detected that group applies one of the pulses comprising the group to the output lead for that cell. Inasmuch as pulses having the same GPRI are applied to only one output lead, each output lead carries a de-interleaved pulse train. These pulses appearing on each output lead are accumulated over a measurement period for subsequent use in identifying the emitter(s) which transmitted these pulses at the associated GPRI.

In accordance with a feature of the invention, each "active" cell incorporates timing circuitry which provides the inter-pulse PRI for each pulse comprising a group detected by that cell. For any "active" cell, this inter-pulse PRI data, provides the temporal components of a pulse train occurring at the GPRI and detected by that cell. These temporal components characterize the type of emitter (stable or exotic) and its complexity (staggered, sawtooth or sine wobulated and the like) which transmitted the corresponding pulse train de-interleaved by that "active" cell. As such, these temporal components are then used to generate a histogram and/or are applied as input to a processor, along with other data, to further identify the emitter.

BRIEF DESCRIPTION OF THE DRAWING

The teachings of the present invention may be readily understood by considering the following detailed description in conjunction with the drawing, in which:

FIG. 8 graphically depicts an illustrative pulse train, having a group PRI of 36, produced by a three-legged staggered emitter;

FIG. 10 depicts the temporal histogram of the pulse train shown in FIG. 8 as detected by cell 36, utilizing the circuitry of the cell as shown in FIG. 7;

FIG. 13 is a temporal histogram of an illustrative sawtooth wobulated emitter, having a group PRI of 232, as detected by cell 232 utilizing the cell circuitry shown in FIG. 7;

FIG. 14 is a temporal histogram of an illustrative sinusoidal wobulated emitter, having a group PRI of 300, as detected by cell 300 utilizing the cell circuitry shown in FIG. 7;

To facilitate reader understanding, identical reference numerals are used to denote identical elements common to the figures.

DETAILED DESCRIPTION

After reading the following description, those skilled in the art will clearly realize that the teachings of the present invention can be readily employed in any system which is used to process an input signal in order to detect and identify repetitive pulse trains existing therein. Nonetheless, for purposes of simplicity, the invention will be described in terms of a system for radar pulse train de-interleaving and identification of radar emitters.

1. The Electrical Environment and the Composite Signal

Currently, the electrical environment surrounding many geographic areas—particularly those having significant population concentrations and/or those having some strategic importance—generally contain pulsed signals emanating from perhaps as many as 50 to 100 or more separate sources (emitters). Oftentimes these signals are transmitted by a plurality of radar emitters.

Figure 1:
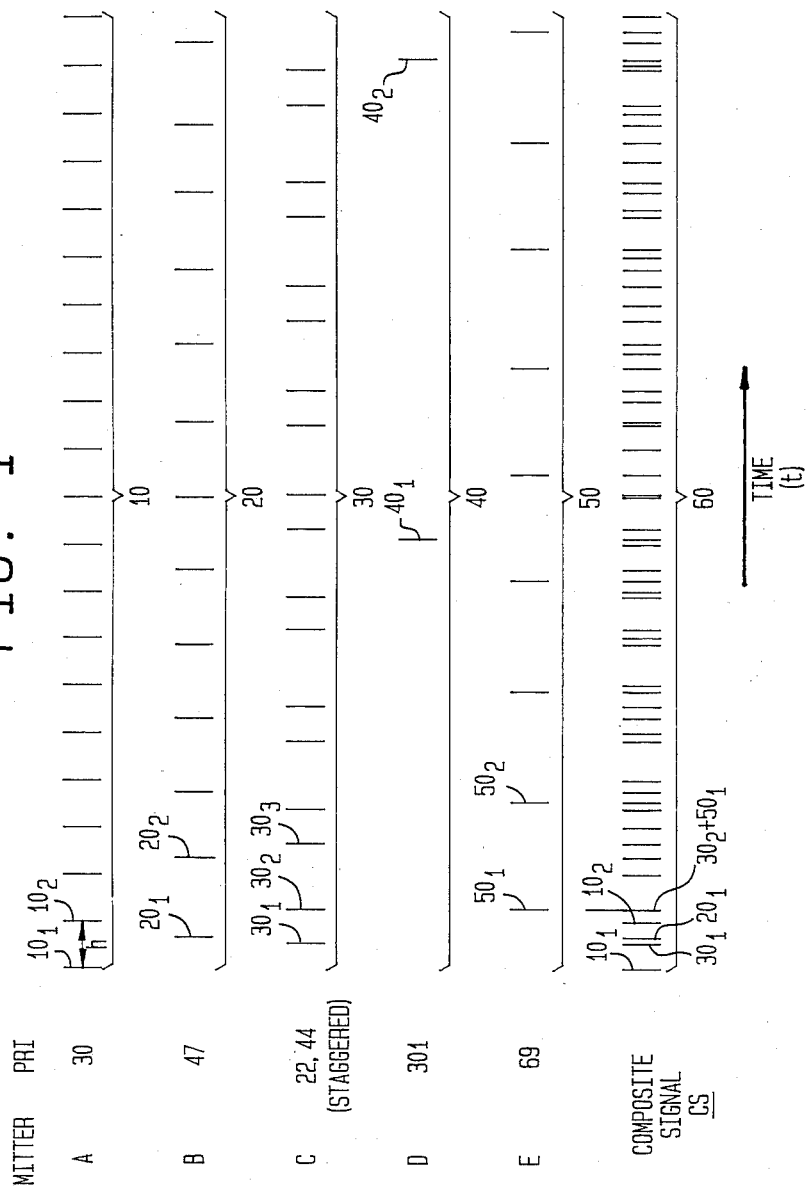
FIG. 1 depicts pulse trains transmitted by five illustrative emitters and the composite environmental signal produced thereby.

FIG. 1 shows five pulse trains, 10, 20, 30, 40 and 50 transmitted by respective radar emitters A, B, C, D and E. Each pulsed signal has its own group pulse repetition interval (PRI) and intra-group pulse pattern which are different from that of the other signals. Each of these pulse trains would generally modulate a different carrier frequency. Emitters A, B, D and E are stable emitters, i.e. each of these emitters continuously produces pulses at a fixed PRI. As shown, pulse train 10 is comprised of individual pulses $10_1$, $10_2$, . . . having a short PRI of 30 time units—illustratively shown as time spacing "h" occurring between pulses $10_1$ and $10_2$. Pulse train 20 is comprised of pulses $20_1$, $20_2$, . . . having a PRI of 47 time units. Pulse train 40 is comprised of pulses $40_1$, $40_2$, . . . having a long PRI of 301 time units. Lastly, pulse train 50 is comprised of pulses $50_1$, $50_2$, . . . having a PRI of 69 time units.

Emitter C is an "exotic" emitter, specifically a two-legged staggered emitter. This emitter produces pulse train 30 which contains groups of two pulses that repeat at a group PRI (GPRI) of 66 time units. Each group has pulses, such as pulse $30_1$ and $30_2$, with different inter-pulse PRIs (the time interval between one pulse and the next successively occurring pulse). Specifically, pulse $30_1$ has a short inter-pulse PRI of 22 time units followed by pulse $30_2$ having a longer interpulse PRI of 44 time units. Since emitters A, B, D and E are each stable, both the group PRI and inter-pulse PRI for each of these emitters are the same.

All the pulsed signals transmitted into the environment by emitters A, B, C, D and E add to cumulatively form, after suitable RF detection, composite signal CS. This signal comprises pulse train 60 having interleaved pulses produced by each of the five emitters. In particular, pulse train 60 is comprised of pulse $10_1$ produced by emitter A, pulse $20_1$ produced by emitter B, pulse $30_1$ produced by emitter C, pulse $10_2$ produced by emitter A, pulse $30_2 + 50_1$—a double pulse formed by the superposition of pulses $30_2$ and $50_1$ which are simultaneously produced by emitters C and E, and so on.

Thus, if one were to receive a very wide broadband signal existing within a geographic area, and extract the pulses existing thereon using any known and suitable RF detection technique, the composite signal would resemble signal CS, although the actual composite signal, in all likelihood, would be comprised of many more than five interleaved pulse trains emanating from many—perhaps 50 to 100 or more—separate radar transmitters. Hence, the actual composite signal would be contain many more pulses than signal CS.

To identify radar signals transmitted into a geographic area, an environmental signal existing there must first be continuously received (and suitably RF detected) to yield a composite signal which is then de-interleaved into its constituent pulse trains. Simultaneously therewith, the characteristics of each pulse train, such as its group and inter-pulse PRIs, must be determined. Thereafter, based upon the characteristics of each pulse train, the associated radar emitter can then be classified. As such, a pulsed emitter identification system is used to detect and identify patterns of pulses existing within a composite signal in order to separate the constituent pulse trains comprising that signal, and thereby identify and classify the corresponding radar emitters.

2. EMITTER IDENTIFICATION SYSTEM

Figure 2:
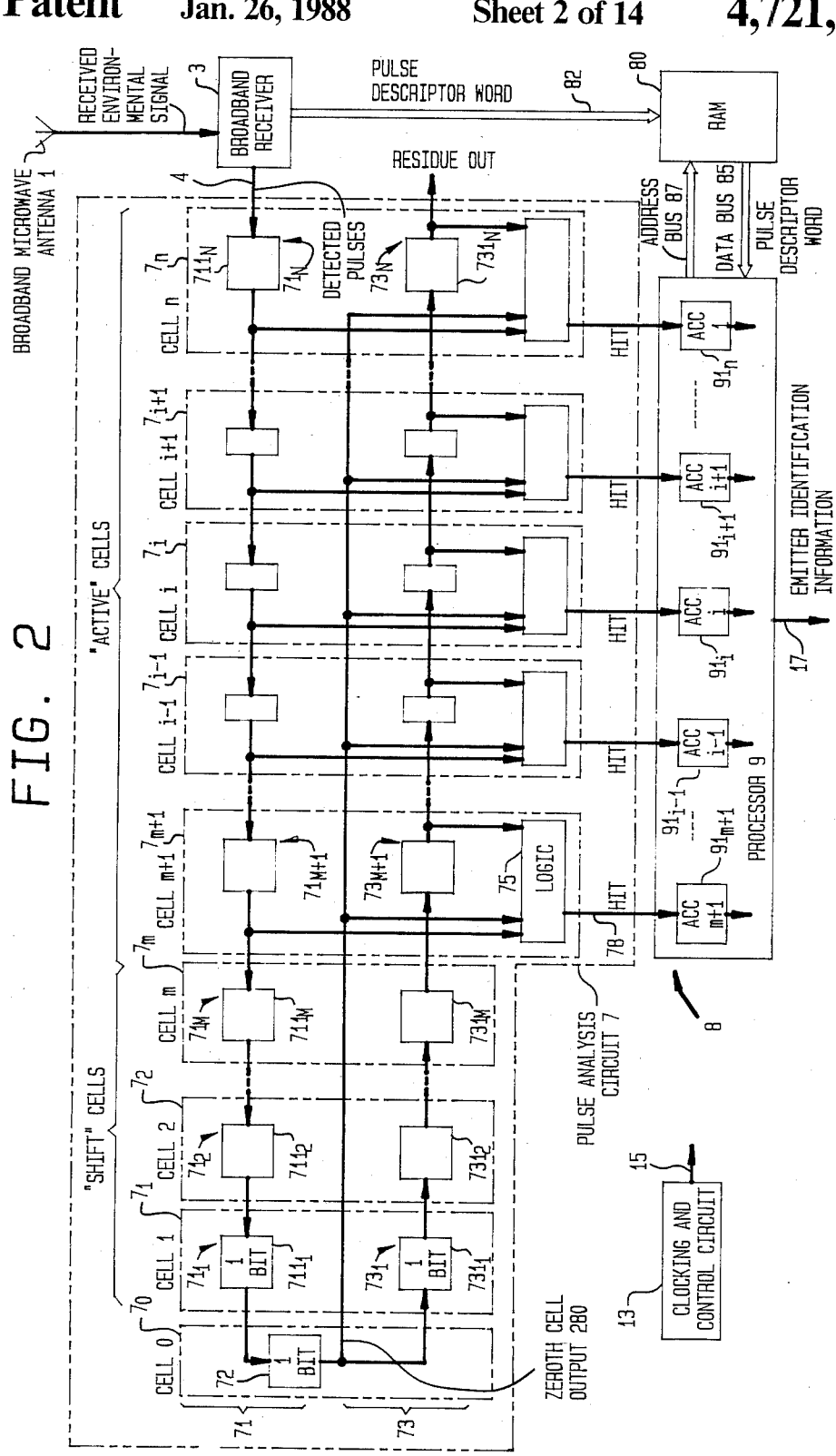
FIG. 2 is a block diagram of a preferred embodiment of a pulsed emitter identification system which utilizes a pulse analysis circuit that embodies the teachings of the present invention.

One embodiment of a basic pulsed radar emitter identification system embodying the teachings of the present invention, and which substantially cures the deficiencies discussed above and inherent in the art, is shown in block diagram form in FIG. 2.

Here, broadband microwave antenna 1 detects an environmental signal and applies it as input to broadband receiver 3. This antenna can be one of many well-known broadband microwave antennas such as an appropriate mechanically steerable microwave dish or an appropriate electrically steerable phased array. Broadband receiver 3, which is well-known in the art, extracts pulses from the environmental signal, appropriately de-modulates each pulse by a suitable well-known process of RF (radio frequency) detection, and thereafter squares the amplitude of each resulting detected pulse and determines its center. All the resulting pulse rising edges are applied, as the detectd pulses in the composite signal, via lead 4, as input to pulse analysis circuit 7. In addition, broadband receiver 3 determines, using any one of many well-known techniques, various information about each pulse. This information typically includes the frequency of the associated carrier, the angle of arrival (AOA), time of arrival (TOA) and the pulse width. For each pulse, this information forms parts of a digital word, commonly known as a "pulse descriptor word" (PDW). Each pulse has its own distinctive PDW.

To ascertain AOA information, receiver 3 may comprise separate synchronously operating receivers, each of which uses a separate antenna. AOA information for any detected pulse can readily be obtained, in a well-known fashion, by analyzing the signals appearing at each of the receivers. To determine TOA information, receiver 3 also contains well-known circuitry to ascertain the time that each pulse is received relative to an internal clock for use in determining inter-pulse PRI data. Also within receiver 3, well-known frequency analyzers provide carrier frequency information for each detected pulse. Spread spectrum signals can be readily detected as long as receiver 3 possesses a sufficiently wide input bandwidth to receive the entire spread spectrum signal.

Each detected pulse is applied, via lead 4, as input to pulse analysis circuit 7. Simultaneously therewith, the PDW corresponding to that pulse is routed, via bus 82, to a data input of random access memory (RAM) 80. RAM 80 temporarily stores these PDWs in their order of arrival. As described in detail shortly, pulse analysis circuit 7 separates the composite signal into its temporal components.

Specifically, as discussed in much greater detail later, circuit 7 sorts all the detected pulses according to their group pulse repetition interval (GPRI). In essence, circuit 7 provides a separate output, such as "hit" output lead 78, for each of many different GPRIs. In operation, circuit 7 detects the GPRI associated with a pulse and, based upon its GPRI, then routes this pulse to the appropriate "hit" output for that GPRI. In this manner, pulse analysis circuit 7 de-interleaves the composite signal into its constitutient pulse trains. The de-interleaved pulses appearing on all the individual "hit" output leads, collectively shown as leads 8, are applied to respective inputs of processor 9. In addition, while each pulse is being de-interleaved by pulse analysis circuit 7, the PDW corresponding to that pulse is read from RAM 80 and applied, over data bus 85, as input to processor 9.

Processor 9 separately accumulates the pulses appearing on each of the "hit" leads over a pre-defined time interval, i.e. the measurement interval. For example, accumulator $91_{m+1}$ totalizes the pulses appearing on "hit" lead 78. At the end of the measurement interval, the counts in all these accumulators, as discussed below, represent the separate pulse trains and their respective GPRIs which comprised the composite signal during that interval, along with the relative occurrence of each pulse train (how many pulses at each GPRI were found to exist). As discussed in detail below, all these counts are used, by processor 9, to generate a temporal histogram at each detected GPRI found in the composite signal. All these histograms can be said to collectively represent the temporal "signature" of the composite signal, with each histogram representing the inter-group PRI pattern for one or more associated emitter(s). Several examples of temporal histograms, shown in graphical form, for five different known emitters are depicted in FIGS. 11-14—which will be specifically discussed below.

Once processor 9 accumulates all the counts and the corresponding temporal histograms have been generated, processor 9, using well known and relatively simple pattern recognition algorithms, analyzes each temporal histogram against known temporal histograms of various different kinds of emitters. In particular, the processor relies on the fact that any pulsed radar emitter, whether exotic or stable, must possess a basic frame rate, i.e. a constant group PRI, which is the fundamental rate at which the pulse train produced by that radar emitter repeats itself, and therefore must possess a certain identifiable signature. Hence, the processor, using relatively simple and well-known pattern recognition techniques, analyzes the temporal histogram generated for each detected group PRI in the composite signal, to identify any signatures, indicative of radar pulse trains, existing therein. For example, in one such algorithm, the processor need only successively compare the temporal histogram for each detected PRI against the temporal signature of each of a number of known radar emitters to find a match therebetween. If a match is not found, the temporal histogram(s) for that emitter may be characterized and archived until a match has been found and the identity of that emitter has been determined.

In addition to receiving all the de-interleaved pulses, via leads 8, processor 9, as noted, also receives, over data bus 85, the PDW for each de-interleaved pulse. The information encoded into each PDW (e.g. frequency, AOA, TOA and pulse width) is used by the processor to further identify and classify each radar emitter. Specifically, the signature analysis, described above, identifies the type of emitter, i.e. its associated group PRI and whether that emitter is stable or complex. The PDW associated with a detected pulse is used by processor 9 to identify further aspects of that emitter, such as its geographic location, which are essential in classifying that radar emitter.

The emitter identification information is applied by processor 9, via leads 17, to a suitable wellknown peripheral (not shown) for display purposes or to other well-known processing equipment, such as a computer system, (also not shown) for subsequent analysis. Clocking and control circuit 13 provides suitable signals, over leads 15, which control the operation of the entire emitter identification system.

Pulse analysis circuit 7 comprises a folded shift register having "n" separate cells: specifically, as shown, cell 0, cell 1, cell 2, ..., cell m, cell m+1, ..., cell i−1, cell i, cell i+1, ..., and cell n, designated as cells $7_0$, $7_1$, $7_2$, ..., $7_m$, $7_{m+1}$, ..., $7_{i-1}$, $7_i$, $7_{i+1}$, ... and $7_n$, respectively. These cells are serially connected and contain synchronously clocked shift elements. The composite signal is applied over lead 4 as input to and, as discussed in detail below, selectively shifted through the folded shift register. This signal can be accurately de-interleaved by pulse analysis circuit 7 whenever the fill rate of the folded shift register (i.e. the number of individual cells that contain a pulse, i.e. a "1", to those that do not contain a pulse, i.e. contain "0") is equal to or less than 1:10. As the fill rate rises, so too does the error rate. Consequently, to de-interleave a 1 MHz pulse stream with minimum error, the rate at which pulses are shifted through the register (the "clock" rate) should be at least 10 MHz. However, the maximum PRI present in such a pulse stream is oftentimes significantly less than 10 MHz. Thus, to simplify the circuitry and minimize errors, only a group of these cells contain logic to de-interleave pulses; while the remainder comprises simple shift elements. In particular, the first m cells (cell 1 through cell m) only contain shift elements which shift pulses through the folded register and, for that reason, are henceforth referred to as "shift" cells (m is an integer within the range $0<m<n$). Each of the remaining n−m cells (cell x+1 through cell n) contains the appropriate logic to detect pulses of a particular corresponding group PRI and for that reason are referred to as "active" cells. For example, in an illustrative implementation having 320 total cells (cell 0 through cell 319), the first 33 cells include cell zero and 32 "shift" cells (cell 1 through cell 32), and the remaining 287 cells (cell 33 through cell 319) are "active" cells.

Specifically, every cell, with exception of cell zero, contains two separate shift elements, such as shift elements $71_1$ and $73_1$ in cell $7_1$, and $71_N$ and $73_N$, in cell n. These shift elements are serially interconnected to form top portion (row) 71, central cell 72 and bottom portion (row) 73. Within each cell, each of these shift elements comprises a 1-bit shift register, such as 1-bit shift registers $711_1$ or $731_1$ in cell $73_1$, and $711_N$ or $731_N$ in cell n.

In operation, all the shift elements are simultaneously clocked at an appropriate clock rate by signals 15 generated by clocking and control circuit 13. As a result, detected pulses are successively shifted into the shift register via lead 4, then shifted left through top row 71, then through central cell 72 (cell zero) and finally shifted right through bottom row 73 of the folded shift register.

The outputs of each shift element within each "active" cell are applied, along with the one-bit output of cell zero (i.e. the detected pulse appearing on lead 280), to a logic circuit, such as logic circuit 75, associated with that cell. Each "active" cell has an associated logic circuit. Each of these logic circuits, described in detail below, is identical and is generally comprised of simple combinatorial logic. The logic circuit for any cell determines whether separate detected pulses simultaneously appear in each of three places: at the output of the one-bit shift elements in both the top and bottom portions of that cell and at the one-bit output of cell zero. Hence, for cell m+1, logic circuit 75 ascertains whether separate pulses simultaneously appear on lead 280 and at the outputs of one-bit shift elements $71_{M+1}$ and $73_{M+1}$. If separate pulses do appear at each of these three places, then the detected pulse appearing at the output of the one-bit shift element in the bottom portion of that cell, e.g. shift element $73_{M+1}$, is categorized as being part of a pulse train having a certain group PRI. Consequently, the logic circuit for that cell, e.g. logic circuit 75 for cell m+1, applies this pulse to the "hit" lead, here lead 78, associated with that cell. From there, this pulse is applied to a respective input of processor 9. Upon the receipt of this pulse, the processor calculates the address of the PDW associated with this pulse. Since RAM 80, as noted, stores PDWs in their order of occurrence, this address is simply governed by the position of the cell in the folded shift register which produced this pulse on its "hit" output lead. For example, if cell i produced a pulse on its hit output lead, the relative address of the associated PDW for that pulse would be at relative location i in RAM 80. Once the proper address is determined, processor 9 applies this address, via address bus 87, to memory 80 and instructs this memory, through well-known but not shown control leads, to read the PDW stored at that address. The resulting PDW is routed to the processor by data bus 85.

Hence, each of the "active" cells detects the occurrence of a pulse stream having a particular group PRI. As will become evident below, cell n produces "hits" for the pulse train having the longest group PRI that pulse analysis circuit 7 can detect; while cell m+1 produces "hits" for the pulse train having the shortest group PRI that pulse analysis circuit 7 can detect. Inasmuch as the group PRIs of pulse trains used in radar signals may span two or more orders of magnitude, the folded shift register used in pulse analysis circuit 7 may contain several hundred separate cells, with each cell containing two 1-bit shift elements. In fact, as noted, one illustrative implementation comprised 320 separate cells.

3. The Pulse Analysis Circuit

With the foregoing discussion of the entire pulse emitter identification system in mind, the description will now shift to a detailed discussion of various embodiments of pulse analysis circuit 7.

Figure 3:
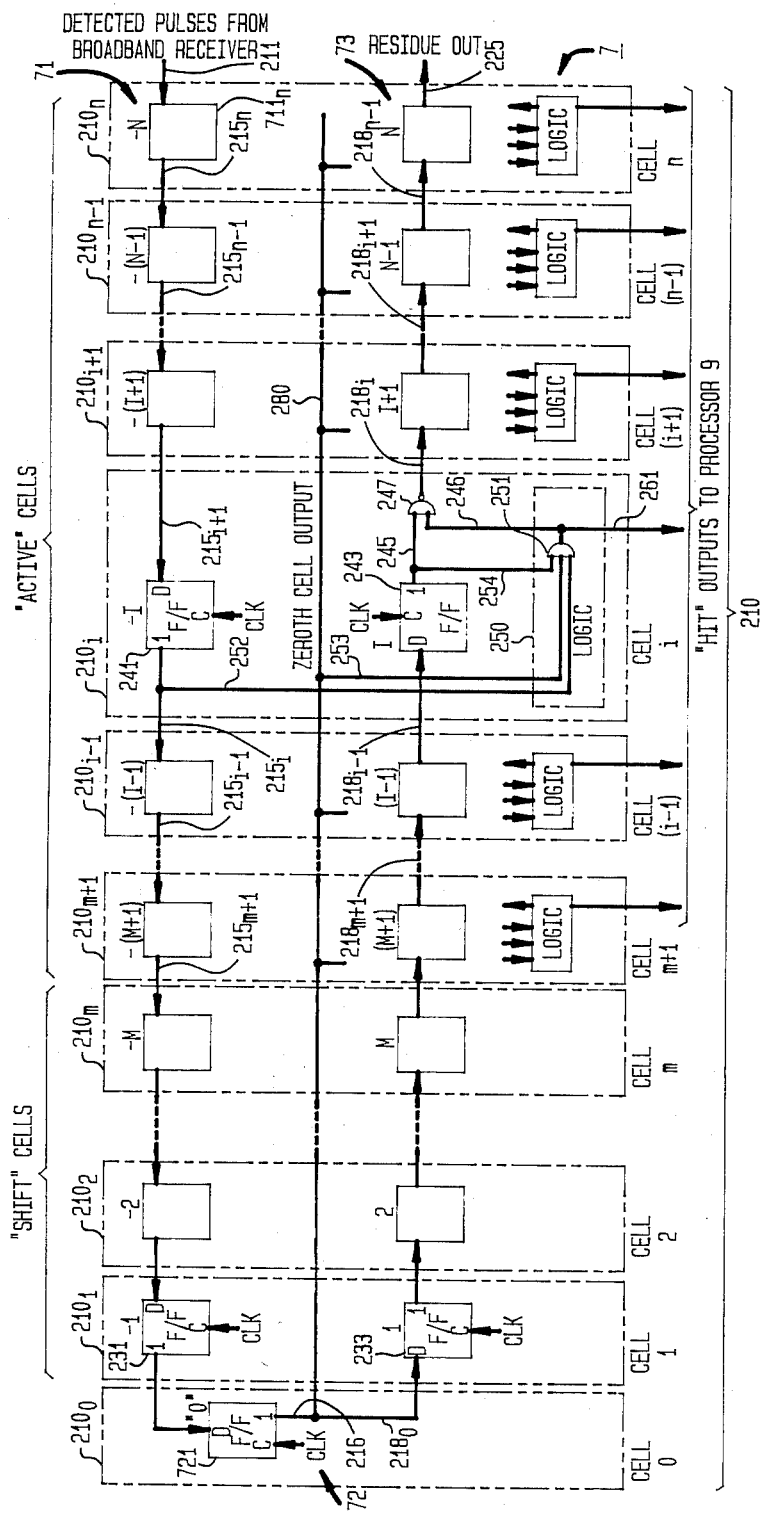
FIG. 3 is a block diagram of a basic embodiment of pulse analysis circuit 7 shown in FIG. 2 which incorporates the teachings of the present invention.

One embodiment of pulse analysis circuit 7 is shown in FIG. 3. Here, this circuit is comprised of cells 210 containing individual cell $210_0$ (cell zero), m identical "shift" cells $210_1$, $201_2$, ..., $210_m$, and n-m identical "active" cells $210_{m+1}$, ..., $210_{i-1}$, $210_i$, $210_{i+1}$, ..., $210_{n-1}$, and $210_n$. As noted, both the "shift" and "active" cells each contains two 1-bit shift elements, such as elements 231 and 233 in $cell_1$ and elements 241 and 243 in cell m, which are all clocked D-type flip-flops. As shown, shift elements of each cell are serially interconnected to shift elements of adjacent cells to form the folded shift register. Cell zero (cell $210_0$) lies at the center of the shift register. Each "active" cell also contains an identical logic circuit, such as logic circuit 250, which, as will shortly be discussed, determines the existence of a pulse train having a certain group PRI. Also, each "active" cell possesses an identical removal gate, such as gate 247, which—for a reason that will shortly become evident—is used to inhibit certain detected pulses from propagating downstream (e.g. from $cell_i$ to $cell_{i+1}$) through bottom row 73 of the folded shift register.

Detected pulses from an output of broadband receiver 3 are applied, via lead 211, as input to pulse analysis circuit 7, and more specifically as input to top portion 71 of the folded shift register, which comprises shift elements $-1, -2, \ldots, -M$ located within the "shift" cells and shift elements $-(M+1), \ldots, -(I-1), -I, -(I+1), \ldots, -(N-1)$ and $-N$ located within the "active" cells. Output from cell zero (cell $210_0$) appears on lead 216 and is applied to "zeroth cell output" line 280. This line is connected to each "active" cell, although to simplify the drawing only the connection to cell $210_i$ is specifically shown. Output from cell zero is also applied as input, via lead $218_0$, to bottom row 73 of the folded shift register, which comprises shift elements $1, 2, \ldots, M$ located within the "shift" cells and shift elements $M+1, \ldots, I-1, I, I+1, \ldots N-1$ and N located within the "active" cells. The output of the last shift element, element N, is applied, to residue output lead 225. The logic circuit within each "active" cell accepts the output of each shift element in that cell along with the "zeroth" cell output appearing on lead 280 as inputs. The logic ciruit uses these inputs in order to determine whether a "hit" has occurred for that cell. If a "hit" has occurred, then the logic circuit assocated with that "active" cell routes one of the detected pulses (e.g. the pulse appearing at the output of shift element 243) causing that "hit" to its associated "hit" output lead, e.g. lead 261 for cell $210_i$, and from there to processor 9.

Now operationally speaking, a detected pulse appearing on lead 211 and produced by broadband receiver 3 will cause a "1" to be shifted into the $-Nth$ shift element existing in cell n in response to a simultaneously occurring clock pulse produced by clocking and control circuit 13 (see FIG. 2). All the shift elements are simultaneously clocked. Consequently, the detected pulse (now a "1" stored within the −N shift element) propagates to the left from shift elements −N to −1 during successive clock cycles. The pulse will eventually be shifted into cell zero (cell $210_0$) and be applied to "zeroth cell output" lead 280 and to shift element +1 located in cell 1 (cell $210_1$). From that point in time and during successive clock cycles, this detected pulse will propagate to the right through shift elements +1 to N. Thus, for a simple case of a stable emitter having a PRI of I clock intervals, three pulses ("1s") spaced I clock cycles apart will simultaneously appear at three places: one pulse at the output of shift element −I, a second pulse on zeroth cell output lead 280 and the third pulse appearing at the output of shift element I. For convenience, a triple pulse occurrence of this sort is hereinafter referred to as a "triplet" pulse or more succinctly as just a "triplet". Logic 250 contains AND gate 251 which detects whether a triplet having a periodicity of I clock pulses occurs, and, if so, simultaneously gates one of the pulses comprising the triplet onto "hit" output lead 261 for cell$_i$. Any pulse, occurring in response to a detected triplet, that is applied to a "hit" output lead is hereinafter referred to as a "hit." Input to gate 251 is provided through leads 252, 253 and 254 which route the outputs of: shift element 241, cell zero appearing on lead 280 and shift element 243 to respective inputs to this gate. Only "active" cells contain logic circuits and hence only these cells produce "hits."

The arrangement thusfar described not only produces a "hit" output from cell$_i$ whenever a pulse train having a periodicity of I clock pulses is detected, but it also disadvantageously produces "hit" outputs at all integer harmonics of I. For the illustrative example in which the folded shift register comprised 320 separate cells (i.e. n=319) with 32 "shift" cells and 286 "active" cells, and a detected pulse train has a group PRI of 40 clock intervals (i.e. I=40), "hit" output pulses would be produced not only from cell 40, but also harmonics of this PRI would cause "hits" to be produced from cells 80, 120, 160, 200, 240, and 280. To prevent "hit" output pulses from occurring at these harmonics, each "active" cell contains a removal gate, such as NAND gate 247 in cell $210_i$. Whenever a triplet is detected by logic circuit 250, then both inputs to this NAND gate are high, and hence the detected pulse which caused this triplet to occur is inhibited by this gate from propagating, over lead $218_i$, to the input of the shift element in next cell, i.e. shift element I+1 in cell $210_{i+1}$. As such, no harmonics will appear on the "hit" output leads of a cell located downstream (to the right) of cell i. Furthermore, even if an emitter should occur having a group PRI shorter than that which can be detected by the first "active" cell—a group PRI of less than 33 clock intervals in the example discussed above, that emitter will still be detected. In particular, that emitter will generate harmonics, one of which (e.g. the 2nd harmonic occurring at a group PRI of 66 clock intervals) will have a group PRI that will fall within the range of the "active" cells. The removal gate in that cell will ensure that no further harmonics of that emitter propagate downstream through the folded shift register. Moreover, inasmuch as doppler pulses have a very short PRI, the removal gates in first few "active" cells effectively prevent doppler interference from propagating down the shift register. As such, the folded shift register is able to detect non-doppler pulse trains obscured by doppler interference.

As previously noted, the shortest group PRI that can be detected has a periodicity of m+1 clock cycles and is detected by cell$_{m+1}$; while the longest group PRI that can be detected has a periodicity of n clock cycles and is detected by cell$_n$. The resolution of pulse analysis circuit 7 can be increased by increasing the clock frequency, i.e. shortening the clock cycle. In addition, the dynamic range of this circuit, i.e. the range of group PRIs that the circuit is capable of detecting, can be widened by increasing the number, n, of cells, particularly "active" cells, used to implement the folded shift register or even by cascading separate pulse analysis circuits (stages) together. To reduce the total number of required cells used in such a cascaded arrangement, each of the successively cascaded pulse analysis circuits should run at an incrementally slower clock rate.

The pulses exiting the folded shift register, via residue output lead 225, possess a relatively low PRI, equal to the input PRI divided by n. Hence, these pulses can be applied to an appropriate input of a computer, specifically a microprocessor, that has been suitably programmed to look for triplets having relatively long periodicities, in excess of n clock periods. Since the rate of the pulses exiting the shift register will ordinarily be far less, usually by several orders of magnitude, than the instruction cycle time of the computer, identification of pulse trains having long PRIs is well within the speed capabilities of currently available microprocessors.

Figure 4:
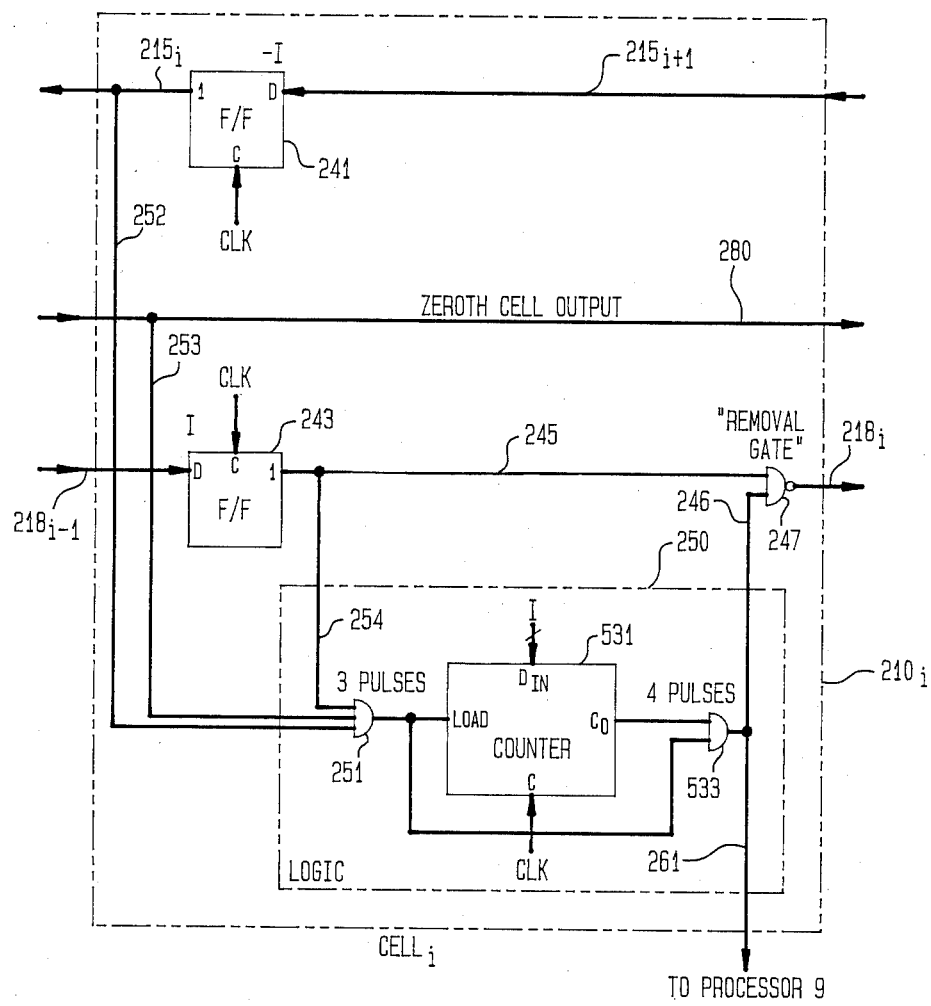
FIG. 4 is a block diagram of one embodiment of "active" cell $210_i$ existing within the pulse analysis circuit shown in FIG. 3.
Figure 6:
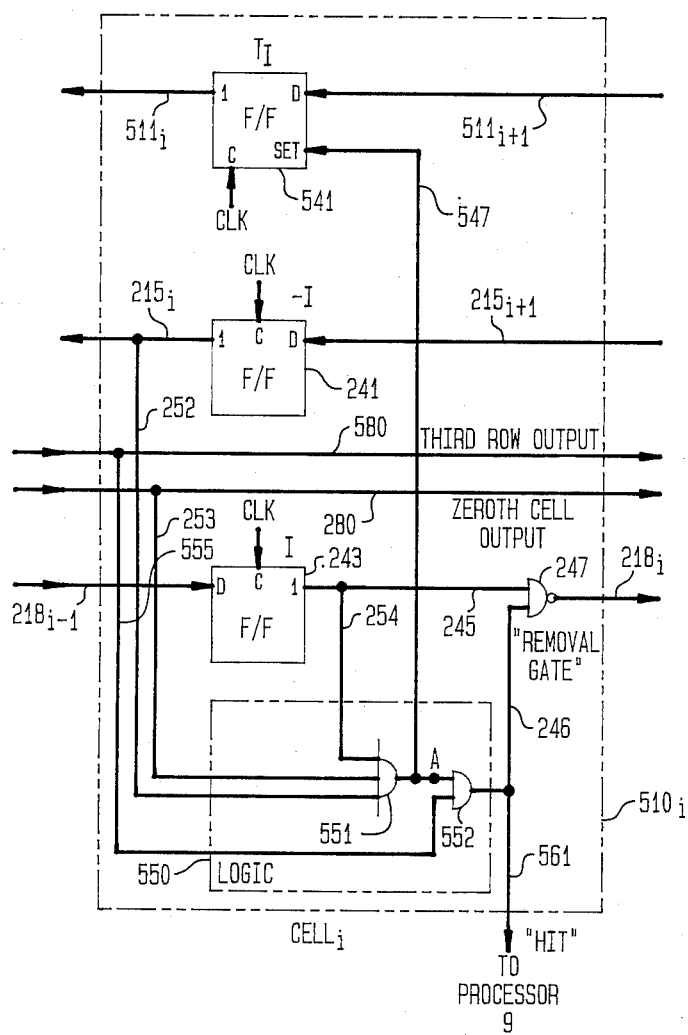
FIG. 6 is a block diagram of "active" cell $510_i$ existing within the pulse analysis circuit shown in FIG. 5.

Two alternate embodiments of the circuitry used to implement all the n-m "active" cells are shown in block diagram form in FIGS. 4 and 6. The embodiment shown in each of these figures relies on detecting not only a triplet but also a fourth simultaneously occurring pulse to produce a "hit". Consequently, both of these embodiments possess higher noise rejection than does the embodiment shown in FIG. 3 and are quite suited for detecting short-on-time emitters. Inasmuch as all of the n-m "active" cells are identical from the standpoint of their block diagrams, both of these figures, for purposes of simplicity, only show the block diagram of a single cell in detail, i.e. cell i.

As depicted in FIG. 4, counter 531 and "AND" gate 533 are connected, within logic circuit 250, between the output of gate 251 and an input of removal gate 247. Whenever gate 251 detects a triplet, counter 531 is loaded with the number of its cell. Illustratively, for cell $210_i$, the counter is loaded with the value "I"; for cell $210_{i-1}$ (not shown in FIG. 4), the counter would be loaded with the value "I−1" and so on for the other "active" cells. Each clock pulse occurring between successive triplets causes the counter to successively decrement its contents by one. If the contents of counter 531 reaches zero at the occurrence of a triplet, then both inputs to AND gate 533 become "1" and a pulse is produced by this cell and appears on "hit" output lead 261. By requiring counter 531 to decrement from the value "I" to zero (an additional condition) before a pulse appears on the "hit" output lead, this embodiment effectively tests for the occurrence of four pulses spaced I clock periods apart—rather than just a triplet of three such pulses—before producing a "hit" output. As a result, the embodiment shown in FIG. 4 possesses excellent noise rejection.

Figure 5:
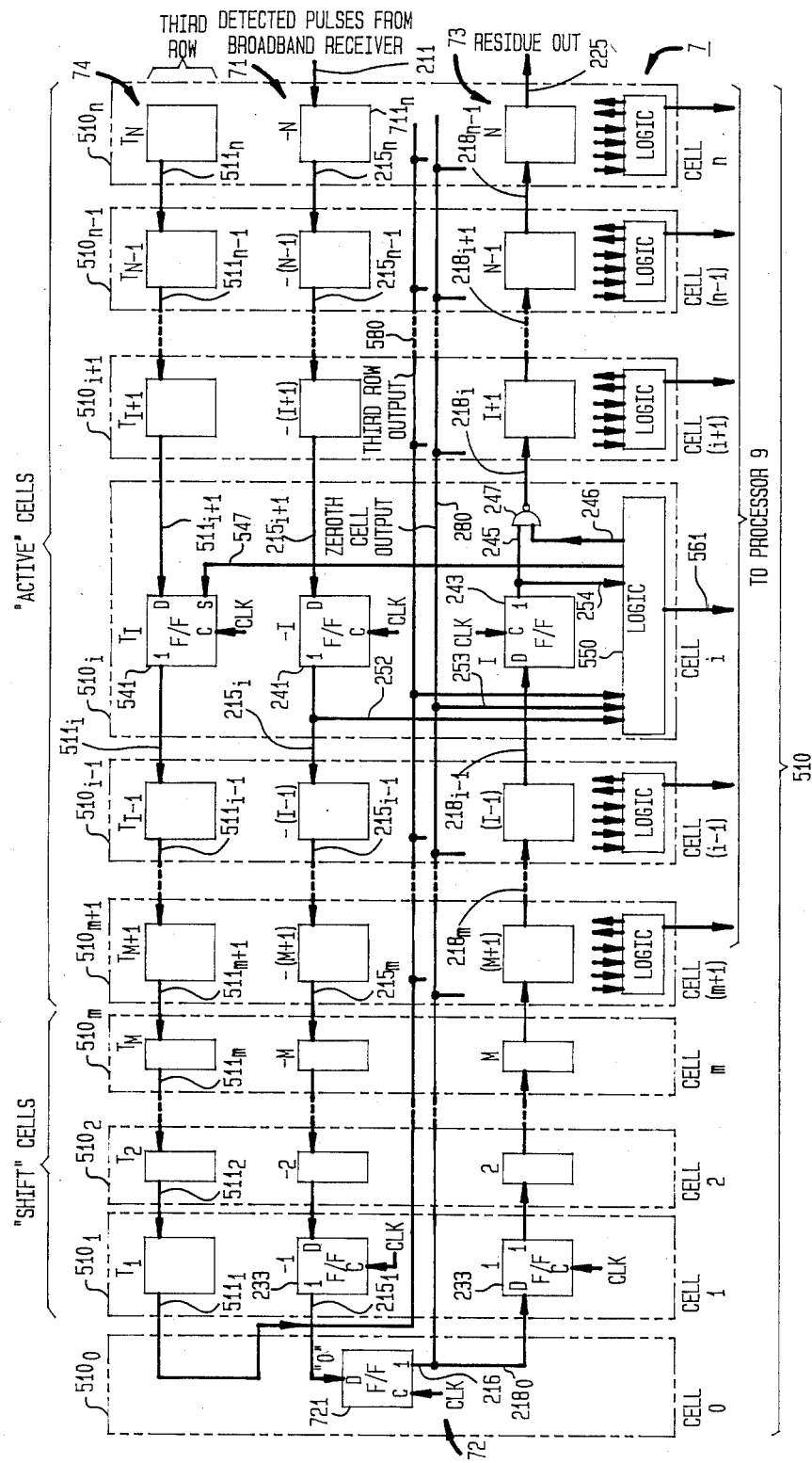
FIG. 5 is a block diagram of another embodiment of pulse analysis circuit 7 which incorporates the teachings of the present invention.

FIG. 5 shows another embodiment of pulse analysis circuit 7 that utilizes the circuitry shown in FIG. 3; and FIG. 6 depicts a detailed block diagram of the circuitry used to implement one of the cells appearing in FIG. 5, specifically cell $510_i$. This embodiment also possesses high noise immunity by producing a "hit" whenever four pulses simultaneously occur. Here, as shown in FIG. 5, pulse analysis circuit 7 is comprised of zero cell $510_0$, "shift" cells $510_1$, $510_2$, ..., $510_m$, and "active" cells $510_{m+1}$, ..., $510_{i-1}$, $510_i$, $510_{i+1}$, ..., $510_{n-1}$, and $510_n$. This embodiment includes a third row of identical 1-bit shift elements, i.e. third row 74, having elements $T_1$, $T_2$, ..., $T_M$, $T_{M+1}$, ..., $T_{I-1}$, $T_I$, $T_{I+1}$, ..., $T_{N-1}$ and $T_N$, located in the folded shift register, in addition to top row 71 and bottom row 73 used in the embodiments shown in FIGS. 2 and 3. All the shift elements in top row 71, bottom portion 73 and third row 74 are simultaneously clocked. All the shift elements in the third row of the "shift" cells merely forms a serially connected shift register, with the input to each element being the output of the preceeding element.

Inasmuch as all the "active" cells use identical circuitry, only cell $510_i$ will be specifically discussed. Now, whenever a triplet occurs in cell $510_i$, a "1" appears at the outputs of flip-flops 241 and 243 and on zeroth cell output line 280. In response to this, logic circuit 550 applies a "1" bit to the set (S) input of flip-flop 541. In particular, AND gate 551, as shown in FIG. 6, located within logic 550 detects the triplet appearing on leads 252, 253 and 254 and, in response thereto, applies a "1" bit to the set input of flip-flop 541. This flip-flop, as shown in FIG. 5, is located within cell $510_i$ and forms part of third row 74. This "1" bit propagates to the left towards cell zero (cell $510_0$) during successive clock intervals and is then applied to third row output line 580. Logic 550 only produces a pulse on "hit" output line 561 if a triplet occurs on leads 252, 253 and 254, and a "1" (a pulse) simultaneously appears on third row output line 580. As shown in FIG. 6, this condition is detected by AND gate 552 which is responsive to the triplet detected by gate 551 and the pulses appearing on third row output lead 580. In this manner, a "hit" occurs on lead 561 if four pulses are simultaneously present rather than three, as required in the embodiment shown in FIG. 3. This advantageously provides substantially the same high degree of noise immunity as the circuit shown in FIG. 4 but without the need to incorporate counters into the circuitry of each cell. As described before, gate 247 functions as a removal gate to prevent the pulse that produced a triplet, within cell $510_i$, from propagating further to the right through bottom row 73 of the shift register. To further increase detection probability, particularly for detecting short-on-time emitters, additional rows of shift elements, identical to third row 74 along with separate row output leads and wired to logic circuit 550, can be incorporated into the folded shift register.

Figure 7:
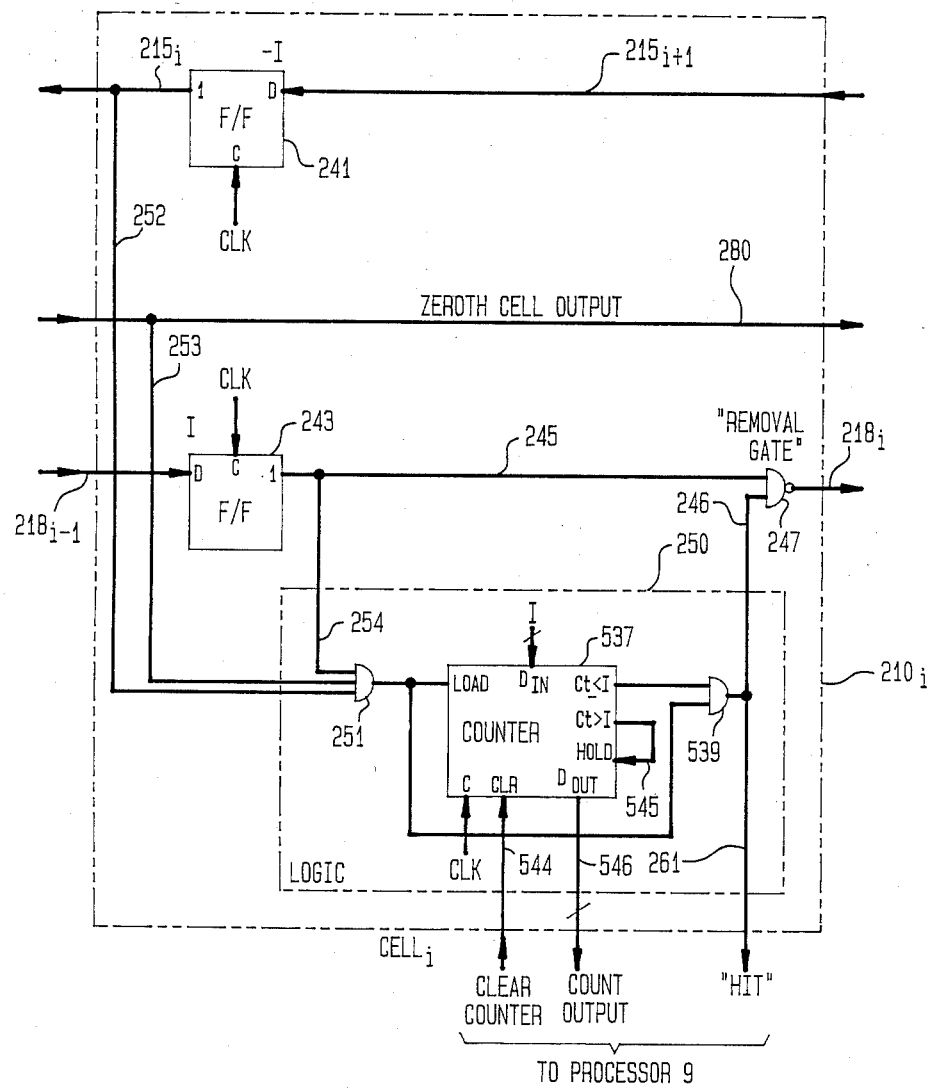
FIG. 7 is a block diagram of an alternate embodiment of "active" cell $210_i$ shown in FIG. 3.

A second embodiment of "active" cell $210_i$ used in the embodiment of pulse analysis circuit 7, shown in FIG. 3, is depicted in FIG. 7. The embodiment shown in FIG. 7 is particularly suitable for use in detecting exotic emitters. Here, each cell detects a pulse train occurring at a specific group PRI and provides the a processor with the relative time, measured in clock intervals, up to a value of "n" for that cell (e.g. "I" for cell i), between successive triplet hits. As will now be discussed in detail, this relative timing information resolves any radar pulse train, having a group PRI, into its temporal components. To facilitate understanding, this discussion preceeds the detailed discussion of the circuitry shown in FIG. 7.

Now, to understand the manner in which the embodiment shown in FIG. 7 detects any type of radar emitter—whether exotic or stable, one must keep in mind the fact that all radar emitters, whether exotic or not, generate a pulse train that contains groups of pulses that repeat at a group PRI (sometimes referred to as a "frame rate"). For radar emitters, the group PRI has a constant time value. For a stable emitter, each pulse group will contain only one pulse having a fixed PRI. Inasmuch as the pulse group from a stable emitter only contains one pulse, its fixed PRI is also its group PRI. By contrast, any exotic radar emitter will produce two or more pulses for each group. Some of these pulses, for example in multi-legged staggered emitters, will have shorter PRIs than others. Alternatively, for wobulated emitters, the PRIs of the pulses within each group will vary with time. Nonetheless, each group of pulses will occur at a constant group PRI.

Consider for the moment, the illustrative pulse train shown in FIG. 8 and produced by a three-legged staggered emitter. For this emitter, the pulse train consists of separate identical groups of 3 pulses. Four such groups 1010, 1020, 1030 and 1040 are shown in this figure. Group 1010 consists of pulses 1011, 1012 and 1013 and group 1020 consists of pulses 1021, 1022 and 1023. This pulse train has a group PRI of 36 clock pulses. As such, any one of these groups (e.g. group 1020) is displaced to the right 36 clock intervals from the previous group (e.g. group 1010). Not only is there a 36 clock interval spacing between the first pulse of each of two adjacent groups, e.g. spacing "a" between pulses 1011 and 1021 of groups 1010 and 1020, but there is also a 36 clock interval spacing between any corresponding pair of pulses in two adjacent groups (e.g. spacing "b" between corresponding pulses 1012 and 1022 of groups 1010 and 1020, respectively, and spacing "c" between corresponding pulses 1013 and 1023 of groups 1010 and 1020, respectively). Each number in parentheses shown in this figure represents a corresponding pulse spacing measured in clock intervals. Now, because we are considering a staggered emitter, there are pulses within any one group that have a shorter inter-pulse PRI than the group PRI. Specifically, within group 1010, pulse 1011 preceeds the next pulse, pulse 1012, by 3 clock intervals, i.e. spacing "d". Hence, pulse 1011 has an inter-pulse PRI of 3, with respect to pulse 1012, and a group PRI of 36, with respect to corresponding pulse 1021. Likewise, pulse 1013 follows pulse 1012 by 6 clock intervals, i.e. spacing "e". Hence, pulse 1012 has an inter-pulse PRI, with respect to pulse 1013, of 6 clock intervals and a group PRI, with respect to corresponding pulse 1022, of 36 clock intervals. Lastly, pulse 1013—the last pulse in group 1010—is followed 27 clock intervals later (spacing "f") by pulse 1021—which is the first pulse in group 1020. Consequently, pulse 1013 has an inter-pulse PRI of 27 clock intervals, with respect to pulse 1021, and a group PRI of 36 clock intervals, with respect to corresponding pulse 1023.

For pulses having a group PRI of 36, cell 36 continually provides the processor, e.g. processor 9 in FIG. 2, with the inter-pulse PRI for each detected pulse and the number of times a pulse having that inter-pulse PRI has occurred. This is readily accomplished by incorporating resettable counter 537 into the circuitry for cell 36, as shown in FIG. 7. This counter increments its contents by "1" each time a clock interval, up to a maximum of 36 clock intervals, occurs between any two successive pulses. In general, the counter is programmed to count up to a maximum of "I" clock intervals for cell i. Each detected triplet pulse resets the counter to zero. Every "active" cell contains such a resettable down counter. In addition, every "active" cell has an associated table previously set up within the memory used by processor 9, and that table contains separate accessible locations equal in number to the maximum count for that cell. For cell 36, its associated table contains 36 separate locations; for cell 60, its table contains 60 separate locations; and for cell$_n$, its table would contain n separate locations as so on for the other cells. At the occurrence of any triplet "hit" in any cell, processor 9 reads the contents of the counter and, using that count, accesses the table for that cell and increments the contents of the location, within that table and corresponding to that count, by one. The processor also increments the totalized count for that cell stored in the last location in the table. This incrementation process repetitively occurs whenever pulses are being detected and the contents of the counter is less than the cell number, for example 36 for cell 36.

Figure 9:
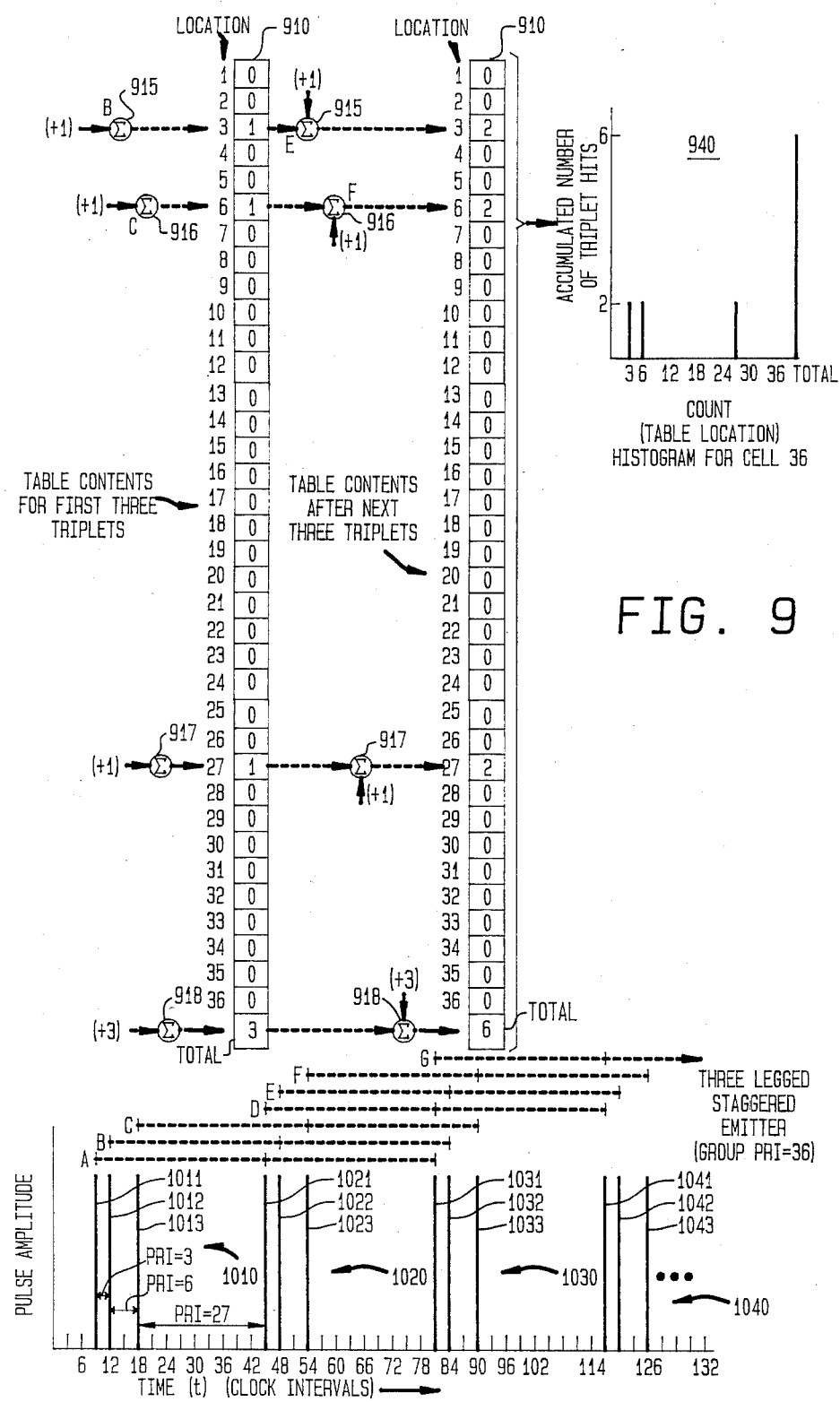
FIG. 9 is a diagram which illustrates the process of developing a temporal histogram from interpulse PRI information for each pulse produced by an exotic emitter, and specifically using the inter-pulse PRI information for various pulses comprising the pulse train shown in FIG. 8 and detected by cell 36.

FIG. 9 illustrates this accumulation process for cell 36. Here, table 910, having thirty seven separate locations, stores the accumulated (totalized) counts in thirty six separate locations order to generate the histogram for cell 36 and also stores a totalized count for the entire cell in the last (37th) location.

Assume, for purposes of discussion, that pulses 1011, 1021 and 1031 collectively form the first triplet. This triplet is indicated by dashed line "A". The occurrence of this triplet causes a "hit" to occur on lead 261 (shown in FIG. 7). In response to this "hit", processor 9 resets counter 537 to zero by applying an appropriate control signal to lead 544. In addition, the earliest pulse in this triplet, i.e. pulse 1011, is inhibited from propagating downward (to the right) through the folded shift register by removal gate 247. Thereafter, the counter increments its contents by one at each successive clock interval until the next triplet occurs. This next (second) triplet, comprised of pulses 1012, 1022, and 1032, occurs three clock intervals later and is indicated by dashed line "B". This triplet also causes a "hit" to occur. In response to this "hit", processor 9 reads the count in counter 537. Inasmuch as the count now equals three, processor 9 then increments the contents of location three in table 910 by one and thereafter resets the counter to zero. Adder 915 represents this incrementation process. At the same time, removal gate 247 prevents pulse 1012 from propagating further though the folded shift register. The same process repeats with the third triplet, indicated by dashed line "C" and comprised of pulses 1013, 1023 and 1033, and the fourth triplet indicated by dashed line "D" and comprised of pulses 1021, 1031 and 1041. Since these triplets occur with inter-pulse PRI spacings of 6 and 27, these two triplets cause locations 6 and 27, respectively, in table 910 to be incremented by one. Adders 916 and 917 represent these two incrementation processes performed by processor 9. Processor 9 also provides a totalized count of all "hits" occurring in cell 36, as represented by adder 918. After these first three triplets have occurred within a span of 36 clock intervals, the "total" count equals three. The occurrence of the next three subsequent triplets, indicated by dashed lines "E", "F" and "G", within the next span of 36 clock intervals causes the 3rd, 6th and 27th locations in table 910 to be incremented by one to the value two and the "total" location to be incremented by three to the value six. This process continues with each successive triplet.

After a given measurement time has elapsed, the temporal components of a de-interleaved pulse train, having a group PRI and detected by the corresponding cell, are indicated by the specific locations in the table for that cell into which triplet "hits" have been accumulated. A non-zero count in any location indicates that a triplet pulse having the inter-pulse PRI associated with that location has occurred. The type of emitter is indicated by the specific number of accumulated triplet "hits" occurring in each of these locations at the end of this measurement time. For any "active" cell, the accumulated count occurring in each location in the table plotted against the relative address of each location provides a temporal histogram showing the inter-pulse PRIs of the de-interleaved pulse train occurring at the group PRI for that cell. Histogram 940 is the temporal histogram for pulse groups 1010 through 1040 produced by the three legged staggered emitter having a group PRI of 36 shown in FIG. 9.

At the end of a suitable measurement period, the illustrative pulse train shown in FIG. 9 produces the temporal histogram shown in FIG. 10. As shown, this diagram indicates, by lines 1150, 1160 and 1170 that this pulse train comprises three components having inter-pulse PRIs of 3, 6 and 27 clock intervals, respectively. The totalized count for cell 36 is indicated by line 1180. Since each pulse group contains three pulses each having a different inter-pulse PRI, the totalized count increases three times as fast as does the count for each inter-pulse PRI. Here, each of lines 1150, 1160 and 1170 is shown scaled to the amplitude of a single stable emitter, i.e. an amplitude of 1, and thus line 1180 has an amplitude of three. Characteristically speaking, a stable emitter in any cell will produce a a single line (single component) histogram having a totalized count of one; while an exotic emitter will produce a histogram having multiple lines (multiple components) and a totalized count greater than one. The totalized count rises with the number of components. For example, a two legged staggered emitter will appear as two components each having a count of one, and with a totalized count of two; a three legged staggered emitter will appear as three components each having a count of one, and with a totalized count of three; and a four legged staggered emitter will appear as four components each having a count of one, and with a totalized count of four and so on. Sine and sawtooth wobulated emitters, as discussed later, which also possess multiple components, will also have a totalized count in excess of one.

Figure 11:
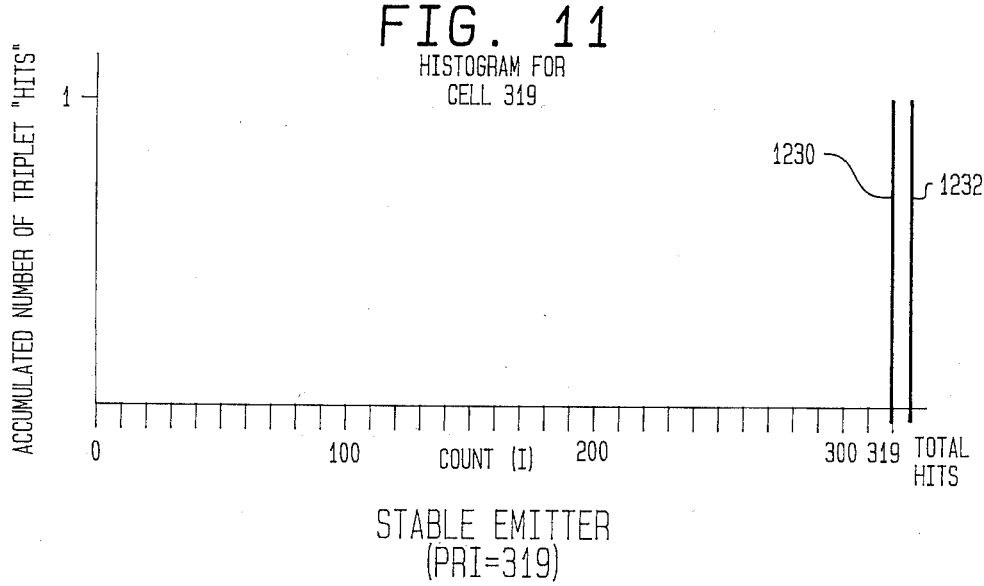
FIG. 11 is a temporal histogram of an illustrative stable emitter, having a PRI of 319, as detected by cell 319 utilizing the cell circuitry shown in FIG. 7.
Figure 12:
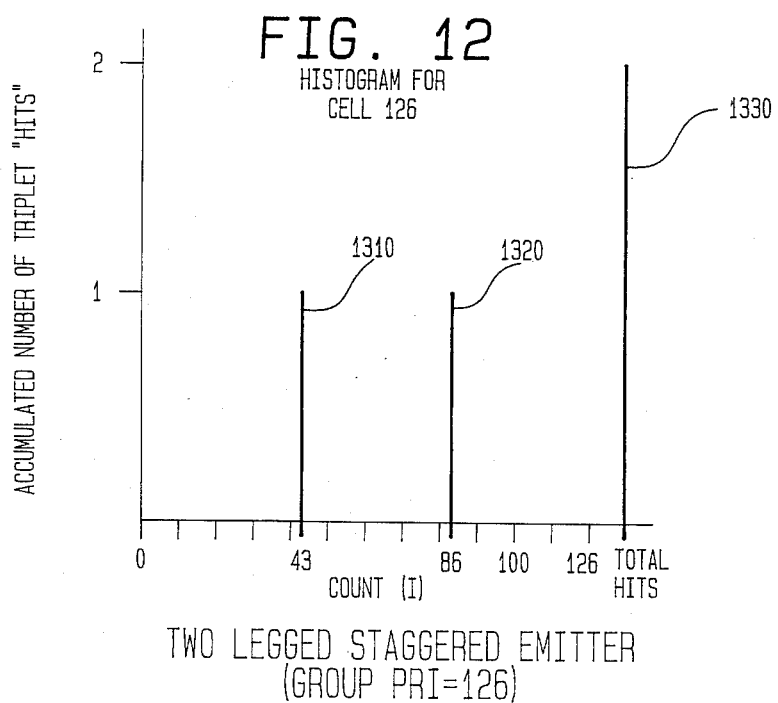
FIG. 12 is a temporal histogram of an illustrative two-legged staggered emitter, having a group PRI of 126, as detected by cell 126 utilizing the cell circuitry shown in FIG. 7.

Illustrative histograms of various other emitters, as would be detected by cell 210, shown in FIG. 7, are depicted in FIGS. 11-14. Specifically, FIG. 11 depicts the temporal histogram for a stable emitter having a group PRI of 319 and detected solely by cell 319. Because this emitter is stable, i.e. only produces pulses having a PRI of 319, all the triplet "hits" appear at 319 and at no other PRI. This is shown by line 1230 occurring at count 319 and having an amplitude of one. Here, the totalized count for cell 319, shown by line 1232, also has an amplitude of one. FIG. 12 shows a histogram for a two-legged staggered emitter, detected solely by cell 126, having a group PRI of 126 and inter-pulse PRIs of 43 and 86. Here, the two-legged stagger is evident by the accumulation of triplet "hits" at locations 43 and 86, which produce lines 1310 and 1320, respectively, each having amplitudes of 1. The totalized count of "hits" is evident by line 1330 having an amplitude of 2. FIG. 13 shows a temporal histogram for a sawtooth wobulated emitter having a group PRI of 232 and detected solely by cell 232. The totalized count for this emitter is evident by line 1440 having an amplitude of 8. The shape of pulse pattern 1430 is characteristic of a sawtooth wobulated emitter in which the inter-pulse PRI changes as a sawtooth function of time. Lastly, FIG. 14 shows a temporal histogram for a sinusoidally wobulated emitter having a group PRI of 300. Inasmuch as any sine wave changes slowly around its positive and negative peaks (i.e. the sine wave "dwells" at these peaks), the histogram will contain a cusp-like pattern 1560 which is attributable to this dwell.

Not only is cell $210_i$ readily able to detect exotic as well as stable emitters, this cell can also detect those emitters, stable or exotic, that are subject to multipath reception. For example, consider the simple illustrative case of a single stable emitter. This emitter will produce a histogram similar to that shown in FIG. 11 with a single component having an amplitude of 1 located at the PRI for that emitter. The totalized count for such an emitter will also be 1. If this emitter is subject to multipath reception, then only a portion of the signal transmitted by that emitter will be directly incident on the receiving antenna and another portion will be reflected by objects, e.g. buildings, bridges and the like, existing within the environment and will indirectly reach the antenna. As long as these objects are immovable, then a finite fixed phase delay will appear at the receiver between the direct and reflected signals received from that emitter. Owing to path length differences between the two received signals, the histogram will appear as having two fixed components each having an amplitude of one and located at different inter-pulse PRIs. The phase difference, i.e. the time difference between the pulses, will be due to the multipath reception. If the object moves, such as an airplane, then the time difference between the separate components will vary over an interval of time and then disappear. By contrast, two stable emitters having the same PRI will behave differently. Of course, each of these emitters will possess a single-component histogram with a totalized count of one. However, owing to phase and frequency differences between the clocks in each of these two emitters, the transmitted pulses from these two emitters will cyclically "beat against" each other. Although the pulses from both emitters will have the same PRI and will be detected by one particular cell, the single component legs of these two emitters will appear to walk in and out of ("beat against") each other in the histogram for that cell. Over time, the movement of each leg will appear as a bell-shaped pattern. As such, an emitter subject to multi-path reception, particularly caused by moving objects, can be readily distinguished from other emitters.

With these points in mind, the discussion will now center on the specific circuitry used to implement cell $210_i$ shown in FIG. 7. As noted above, this cell is identical to all the n-m "active" cells—i.e. cells $210_{m+1}, \ldots 210_{i-1}, 210_{i+1}, \ldots$ i.e. cells used in pulse analysis circuit 7 shwon in FIG. 3.

Specifically as shown in FIG. 7, whenever a triplet occures within cell $210_i$, AND gate 251 applies a pulse to an imput of AND gate 539. As long as the count counter applies a "1", via its "$Ct \leq I$" output, to the other input to AND gate 539, and this gate produces a pulse, that appears on "hit" output lead 261, in response to the detected triplet. In response to this "hit" present on lead 261, processor 9 reads the contents of the counter, appearing on leads 546, and thereafter applies a control signal to lead 544 which resets the counter to zero. Removal gate 247, as discussed, prevents the first pulse in the triplet from propagating, over lead $218_i$, downward through the folded shift register. Since the counter is clocked synchrononusly with the shift register, the counter increments its contents by one with each successive clock pulse occurring subsequent to being reset by processor 9. The counter will continue incrementing until its contents reach the value "I". If no triplet is detected at the nexct clock pulse, then the counter will apply a suitable level to its "$Ct > I$" output. Since, this output is connected to the "HOLD" control input of counter 537, the contents of the counter will remain at the value "I" until reset by the processor at the occurrence of the next triplet, regardless of when that triplet occurs.

Now with the foregoing in mind, the embodiment of cell $510_i$ shown in FIG. 6 and which does not contain a counter but which provides a high degree of noise immunity and a high probability of detection for short-on-time emitters, can be modified to provide inter-pulse PRI data for exotic emitters. This modification would consist of incorporating a resettable down counter and its associated logic, specifically counter 537 and its inter-connected gate 539 situated with logic 250 as shown in FIG. 7, into logic 550, specifically at point "A", depicted in FIG. 6. Both the clear control input to and the parallel count output from the counter would become outputs of cell $510_i$ and, in turn, be connected to the processor.

The circuitry of the various embodiments of the pulse analysis circuit discussed thusfar, namely those shown in FIGS. 3 and 5, assume that a detected pulse occurs synchronously with and lasts as long as a clock pulse. This rarely occurs in actuality. Each emitter has its own clock frequency which is often quite different from that of the pulse analysis circuit. Furthermore, the width of each detected pulse can vary widely from emitter to emitter. In fact, while some emitters produce pulses having widths far narrower than a clock interval; others produce pulses having widths similar to that of a clock interval. Consequently, over time, if nothing were done to address this, various detected pulses that are shorter than a clock interval and do not occur synchronously with an edge of a clock pulse may not be clocked into the folded shift register and would therefore become totally lost. One technique which can be used to prevent this loss is to stretch each incoming pulse so that its width exceeds the period of the clock pulse, i.e. the stretched incoming pulse spans more than one clock period. This, in turn, permits the shift register to respond to relatively narrow detected pulses.

Figure 15:
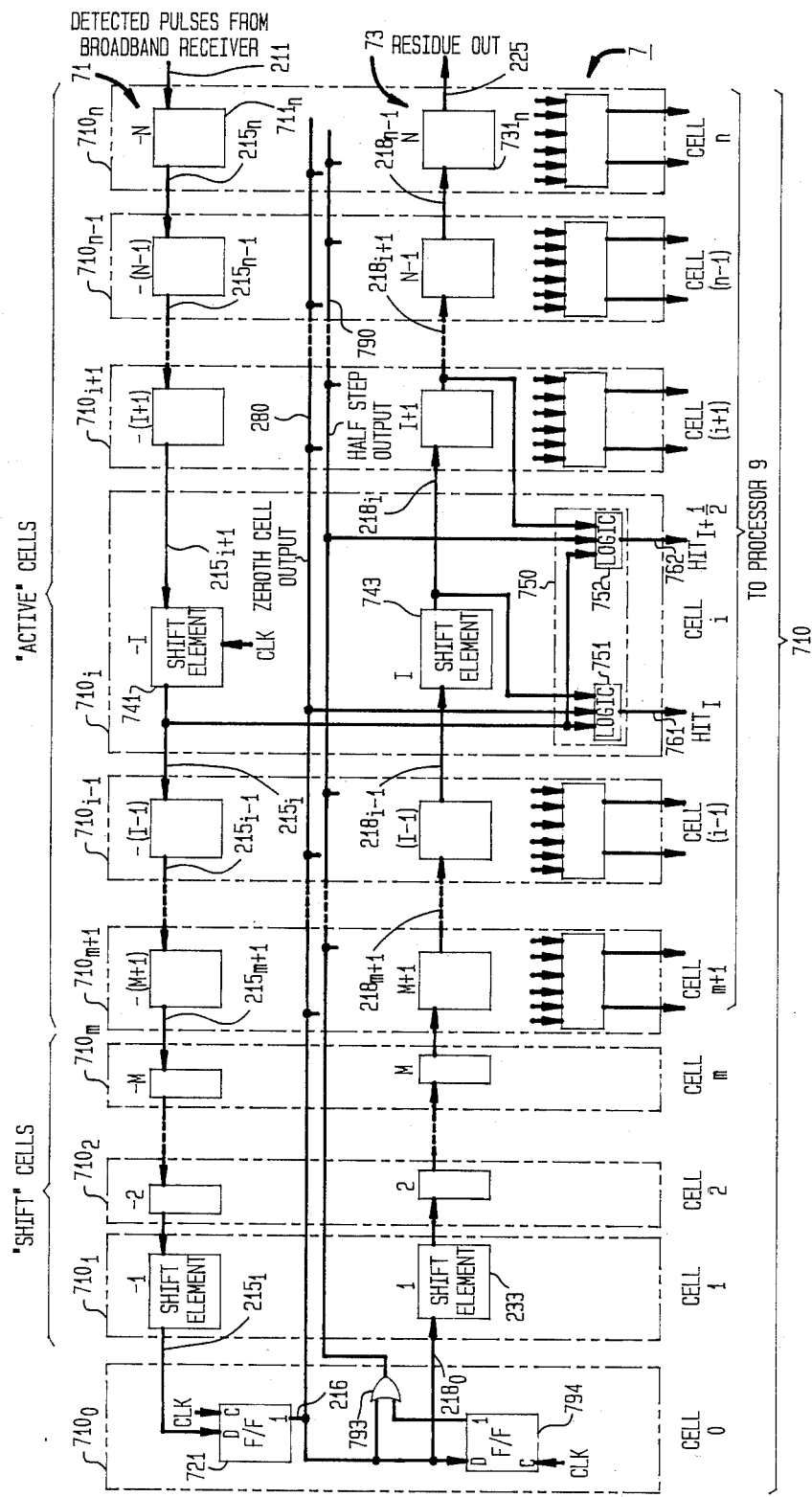
FIG. 15 is a block diagram of another embodiment of pulse analysis circuit 7 which incorporates the teachings of the present invention and is useful for deinterleaving narrow non-synchronized pulses.

FIG. 15 depicts a block diagram of another embodiment of pulse analysis circuit 7 which is suitable for use with narrow non-synchronized detected pulses. This embodiment advantageously provides increased resolution without increasing the number of cells used in the folded shift register. Here, folded shift register 710 can comprise any of the two (see FIG. 3) or three row (see FIG. 5) embodiments thusfar described; however, for purposes of illustration, folded shift register 710 is generally shown as being two-legged and having top row 71, bottom row 73, zeroth cell $710_0$, and m serially connected "shift" cells $710_1, 710_2, \ldots, 710_m$, and n-m serially connected "active" cells $710_{m+1}, \ldots, 710_{i-1}, 710_i, 710_{i+1}, \ldots, 710_{n-1}$ and $710_n$. Since all of the "active" cells are structurally identical, for purposes of brevity, only "active" cell 710$_i$ will now be discussed in detail. This cell comprises shift elements 741 and 743. These shift elements contain separate one-bit shift registers, typically clocked D-type flip-flops, as had been previously described. In addition, cell 710$_i$ also contains circuit 750 which detects "hits" at two group PRIs. Circuit 750 contains two identical logic circuits 751 and 752. Both of these logic circuits can comprise any of the logic circuits previously described; for example, for a two row embodiment, e.g. logic 250 shown in FIG. 3, FIG. 4 or FIG. 7 or, for a three row shift embodiment, logic 550 shown in FIG. 6 or modified as previously discussed. For the structure shown in FIG. 15, logic circuit 751 produces a pulse on "hit" output line 761 in response to pulses simultaneously appearing at the outputs of shift elements 741 and 743 and on zeroth cell output line 280. A pulse on this "hit" output line signifies that a detected pulse has a group PRI of "I" clock intervals. Logic circuit 752 produces a detected pulse that occurs at "I+½" clock intervals. To detect pulses that occur at a ½ clock interval spacing, zero cell 710$_0$ not only contains 1-bit shift element 721 but also a second serially connected 1-bit shift element 794, both of which are clocked D-type flip-flops. As with other embodiments of the folded shift register, shift element 721 produces a pulse on zeroth cell output line 280 after a detected pulse has been shifted leftward through top row 71 of folded shift register 710 and, from there, into the zeroth cell. At the same time, the pulse produced on output lead 216 of shift element 721 is applied to the input of shift element 794 and to one input of OR gate 793, both located within zero cell 710$_0$. Whenever a one is shifted into shift element 721, gate 793 applies a pulse to half step output line 790 which extends over the next two adjacent clock intervals. Logic 752, in responding to a pulse simultaneously occurring at the outputs of shift element −I and shift element I+1 (i.e. the next successive shift element after shift element I in bottom row 73) and on half step output line 790, produces a pulse on "hit" output lead 762 at the occurrence of a pulse having a group PRI of "I+½" clock intervals. Hence, by using two logic circuits within each "active" cell, each of these cells can resolve the occurrence of each of two group PRIs spaced ½ clock interval apart as well as detecting PRIs therebetween. As a result, the resolution of the folded shift register is effectively doubled without doubling the number of separate shift elements. Furthermore, although the removal gates, such as gate 247 in FIG. 3, have been omitted from the embodiment shown in FIG. 15 in order to simplify the drawing, these gates nonetheless would be included in any pratical realization of this embodiment and in a manner readily appreciated by those skilled in the art. Moreover, in lieu extending the zero cell output pulse over two clock intervals, top row 71 and bottom row 73 of the folded shift register can be separately and alternately clocked at ½ clock intervals, i.e. all the shift registers which form the top row would first be simultaneously clocked followed ½ clock intervals later by a clock pulse simultaneously applied to all the registers which form the bottom row. This arrangement advantageously simplifies the circuitry by eliminating the need to employ OR gate 793, shift element 794, half step output 790 and a second logic circuit, e.g. logic circuit 762, located within each "active" cell.

Often, an actual non-doppler emitter will transmit an output that has some degree of instability, i.e. its group PRI will vary ("jitter") over a narrow range of values, frequently in excess of one or more clock intervals. In order to detect a jittered emitter, each "active" cell in pulse analysis circuit 7 must be able to detect triplet pulses having a group PRI that extends over a range encompassing several clock intervals, e.g. from "I" clock intervals to "I+2" clock intervals for cell$_i$. To further frustrate detection, a doppler emitter, whenever it transmits pulses, will mask a non-doppler emitter and render the latter very difficult to detect. However, doppler emitters have an extremely high but very stable PRI with negligible jitter. Therefore, a jittered non-doppler emitter can be isolated from a doppler emitter existing in the same environment if each "active" cell possesses the capability of selectively switching between detecting over a "tight" window or a "wide" window of group PRI values. The "tight" window would encompass only one group PRI value, extending over one clock interval, and would therefore be used for detecting and removing a doppler emitter existing at that group PRI. By contrast, the "wide" window of group PRI values would extend over a range of several clock intervals for detecting non-doppler jittered emitters. A block diagram of a further embodiment of pulse analysis circuit 7, which can detect jittered emitters and particularly jittered non-doppler emitters existing in the same environment as a doppler emitter, is shown in FIGS. 16A and 16B—for which the proper alignment of the drawing sheets for these figures is shown in FIG. 16.

Here, pulse analysis circuit 7 is comprised of zero cell 810$_0$, m serially interconnected "shift" cells 810$_1$, 810$_2$, . . . , 810$_m$, and n-m "active" cells 801$_{m+1}$, . . . , 810$_{i-1}$, 801$_i$, 801$_{i+1}$, . . . , and 810$_n$. Each cell contains two one-bit shift elements, such as shift register 231 in top row 71 and shift register 233 in bottom row 72 of the folded shift register. As noted, each of these registers, such as register 741, is typically a clocked D-type flip-flop. Now, for every pulse that is shifted into register 721 in zero cell 810$_0$, that register produces a single pulse on zeroth cell output line 280, as previously discussed. In addition, the zero cell also produces a pulse ("jittered pulse"), which extends over several clock intervals, on line 890. As shown, this jittered pulse occurs as long as a detected pulse (i.e. the second pulse in a triplet) exists in the folded shift register in any one of five places, specifically at locations "P", "Q", "R", "S" and "T"; hence, the jittered pulse extends over five clock intervals, two intervals before, the interval during and two intervals after each detected pulse appears on line 280. Specifically, whenever a detected pulse appears at any of these five locations, lead 841, 843, 845, 847 or 849 routes this pulse to a respective input of OR gate 840 which, in turn, applies this detected pulse as the "jittered" pulse to jittered output line 890. The output of this gate is high as long as a detected pulse is present at any of these five locations. Five is an illustrative though arbitrary choice. By tapping a greater or lesser number of separate locations along top and bottom rows of the folded shift register and routing their outputs, via respective leads to separate respective inputs, of gate 840, the jittered pulse can extend over a greater or lesser number of clock intervals than five. Clearly, as the jittered pulse becomes wider, each "active" cell can detect triplets containing increasingly large amounts of jitter. Since all the "active" cells are identical, the following discussion will now focus on cell 810$_i$.

Cell $810_i$ contains logic circuit 850 which can be set to detect triplets occurring either within a "tight" window of only one group PRI value or within a "wide" window containing a range of group PRI values. Depending upon the state of a control signal applied by processor 9 and appearing on select lead 852, logic 850 will detect triplets in which all its pulses occur only at I clock intervals (the "tight" window), in which case a "hit" will occur on non-jittered "hit" output lead 858, or alternatively in which the first and third pulses in a triplet occur at I clock intervals and the second pulse jitters from I-2 to I+2 clock intervals (the "wide" window) in which case a "hit" will occur on jittered "hit" output lead 856. In particular, detected pulses that appear at the output of shift elements 741 and 743, respectively, are applied, via leads 871 and 872, to respective inputs of AND gate 851. The output of this gate will be high only if these two detected pulses are the first and third pulses in a triplet. Now, if the select signal appearing on lead 852 is low, then a low level will appear at an input to AND gate 853 will remain low; while AND gate 855 will produce a pulse on jittered "hit" pulse PRI within the "wide" window, i.e. from I−2 to I+2 clock intervals. Alternatively, if a high level is applied to select lead 852 by processor 9, then the output of AND gate 855 remains low and AND gate 853 will produce a pulse on non-jittered "hit" output lead 858 if the second pulse in the triplet has an inter-pulse PRI within the "tight" window, i.e. I clock intervals. In either case, as soon as a triplet, whether jittered or not, is detected, a "hit" pulse for that triplet is routed, via OR gate 857, to removal gate 247 which, as discussed, inhibits the first (earliest) pulse in that triplet from propagating further through bottom row 73 of the folded shift register.

Figure 16A:
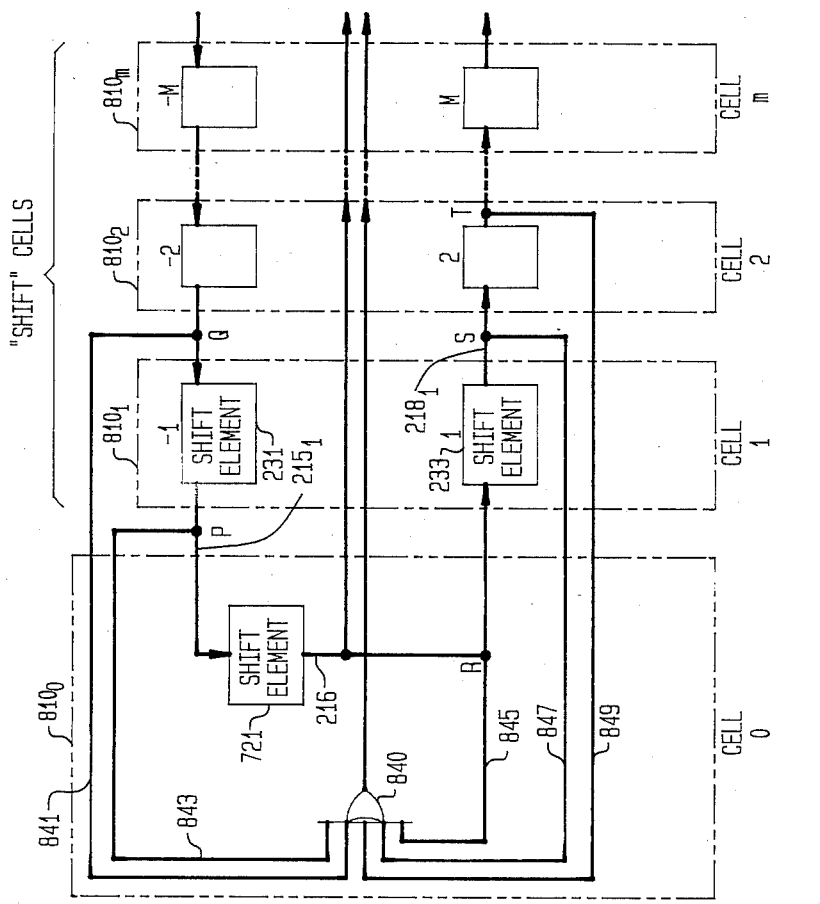
FIGS. 16A and 16B together show a block diagram of a further embodiment of pulse analysis circuit 7 which incorporates the teachings of the present invention and is useful for deinterleaving a composite signal containing both doppler pulses and jittered non-doppler pulses.
Figure 16:
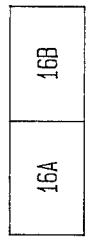
FIG. 16 shows the proper alignment of the drawing sheets for FIGS. 16A and 16B.
Figure 16B:
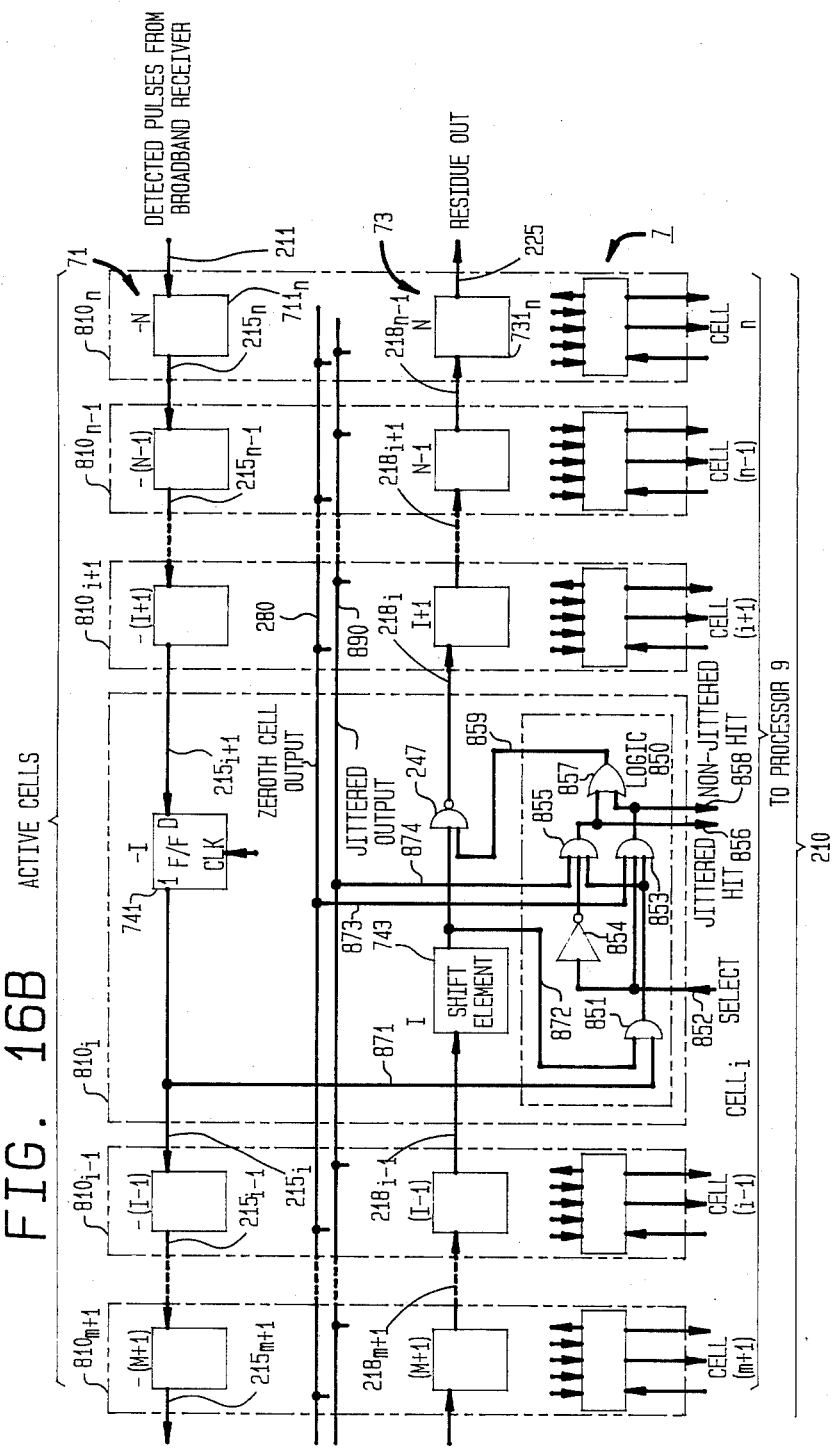

In addition, the embodiment shown in FIGs. 16A and 16B can be readily modified to provide the processor with the capability of independently setting the width of the "wide" window for each "active" cell. To do so, the embodiment would contain several OR gates, such as OR gate 840, each of which taps the outputs of a different combination of locations along the top and bottom rows of the folded shift register. e.g. one such gate might tap five locations; "P", "Q", "R", "S" and "T" while another such gate might tap only three of these locations; "P", "Q" and "R". Each gate would feed a separate jittered pulse output line. Additional logic located within each "active" cell would, in response to an appropriate signal from processor 9, select a particular one of the jittered output lines and route the jittered pulse appearing thereon to gate 853 to determine the occcurrence of a jittered triplet. The processor could select a different jittered output line for different cells. by doing so, one "active" cell could detect a triplet in which the second (center) pulse jitters over, e.g. there clock intervals, while another "active" cell could simultanelusly detect a triplet in which the second pulse jitters over a different number of clock intervals, e.g. five clock intervals.

Nonetheless, in order to detect a jittered non-doppler emitter in the presence of a doppler emitter using the pulse analysis circuit shown in FIGS. 16A and 16B, all the "active" cells would be initially set to detect triplets having only one group PRI, i.e. all the "active" cells would be set to detect triplet pulses that only occur with in that cell's "tight" window. Once a doppler emitter was found at any cell, that cell and the others upstream of it (i.e. those cells to the left of it which dect triplets having PRIs faster than that of the doppler emitter) would continue to detect triplets using a "tight" window; while each of the remaining (downstream) cells would be switched by the processor to emitters present in the environment. Since a doppler emitter possesses a very short PRI which is much faster than that of a non-doppler emitter, the doppler emitter will generally be detected and removed by one of the first few (upstream) "active" cells. In fact, multiple doppler emitters having different group PRIs could occur in an environment. Each doppler emitter would be detected and removed by a corresponding "active" cell. This embodiment would then allow all the remaining "active" cells to detct jittered non-doppler emitters having a wide range of jittering groups PRIs.

Clearly, with the foregoing in mind, those skilled in the art will readily appreciate that the dynamic range of an emitter identification system, which utilizes any of the inventive pulse analysis circuits circuits (stages) together. The circuit to which the detected pulses are applied as input would be clocked at the highest frequency and each successive stage would be clocked at an incrementally lower clock rate. For example, a high speed stream of detected pulses may be applied to a pulse analysis circuit clocked at 100 MHz. The residue from that circuit might be applied as input to a second pulse analysis circuit that is clocked at 20 MHz. Lastly, the residue from the second circuit might be applied as input to a third pulse analysis circuit that is clocked at 5 MHz. The residue from this last circuit, occurring at pulse rates substantially less than 0.5 MHz, would, in all likelihood, be slow enough to be analyzed by a sequential computer (e.g. a micro-processor) using conventional pattern recognition algorithms and, as such, would be applied to an appropriate input of such a device. Furthermore, one or more of the cascaded stages (particularly those operating at a relatively low clock frequency) could be entirely implemented in software, if the computer used to implement any of these stages had a sufficiently fast instruction cycle time. In this case, each cell would be replaced by one or more separate memory locations, and the logic circuit itself would be replaced by an appropriate set (e.g. sub-routine) of program instructions.

Furthermore, to generate enough data to produce a useful temporal histogram from any cell, particularly a histogram which contains enough data to show a pattern indicative of an exotic emitter, processor 9 will ordinarily accumulate inter-pulse PRI information over a measurement period, e.g. 100 milli-seconds to 1 second. If at the end of this period, a histogram produced by any cell does not appear to contain any recognizable patterns, then the processor can continue accumulating inter-pulse PRI information from this cell for inclusion in the histogram. The processor can begin analyzing this information whenever it is able to recognize a known pattern therein. Hence, the period during which the processor is merely accumulating inter-pulse PRI information can vary with each cell and be adaptively changed by the processor as it begins to discern pattern(s) existing in the associated histogram. Once a pattern is discerned and its associated emitter identified, this information can be stored within the processor so as to expedite the process of pattern recognition and thereby aid in the future identification of other emitters.

Each of the pulse analysis circuits described above de-interleaves the composite signal into its constituent pulse trains based upon the group and, in certain embodiments, the inter-pulse PRIs (time of arrival) of each detected pulse. Clearly, this pulse train de-interleaving could be expanded to encompass parameters other than just PRI data. For example, another folded shift register(s)—the non-PRI register—could store parallel digital data, such as the RF carrier frequency, the angle of arrival or other identifying information, for each detected pulse. This non-PRI register would be operated in parallel with the PRI shift register. Consequently, this pulse data would be shifted out of the zeroth cell of the non-PRI register and would be available simultaneously with the occurrence of a triplet in the PRI register. Appropriate combinatorial logic would examine the contents of each corresponding cell of all of the shift registers and utilize the non-PRI pulse data in conjunction with the group and/or inter-pulse PRI data to appropriately de-interleave the composite signal into its constituent pulse trains.

Moreover, pipelining and/or parallel processing can be used to to speed up pattern recognition. In particular, a separate front-end processor can be used merely to continuously accumulate inter-pulse PRI information from each cell. A second processor can be used to actually analyze this data, i.e. the histograms, using suitable pattern recognition algorithms, in order to identify the type of emitter. The second processor, either periodically and/or upon request, would receive inter-pulse and group PRI information from the front end processor. Furthermore, this second processor, if sufficient processing time exists, could utilize the data contained in the pulse descriptor word (PDW) for each detected pulse to further identify and classify each emitter. Since each cell is providing data for only one group PRI, this second processor could itself consist of a group of processors each of which performs pattern recognition on the inter-pulse and group PRI emanating from one or more of the cells. By performing accumulation and pattern recognition for all the cells or for various groups of cells in parallel, substantial amounts of processing time can be advantageously saved. Alternatively, if sufficient processing time is not available to the second processor, then a third processor could be used to further identify and classify each emitter based on the PDW of each of its detected pulses and the emitter type, as ascertained by the second processor. In a similar fashion, the third processor could itself consist of a group of processors each of which obtains analyzed data from the second processor for one or more cells and then performs further analysis using the PDW data for these cells.

Although various embodiments have been shown and described herein, many other embodiments incorporating the teachings of the present invention can be readily devised by those skilled in the art.

I claim:

1. A system for de-interleaving an input signal, having successively occurring input pulses, into a plurality of constituent pulse trains and for identifying at least one emitter that produced an associated one of said constitutent pulse trains, wherein the improvement comprises:

de-interleaving means, responsive to said input signal, for determining the pulse repetition interval of each of said input pulses, and for routing each of said input pulses to a respective one of a plurality of "hit" output leads, wherein each of said "hit" output leads corresponds to a different group pulse repetition interval, and wherein said de-interleaving means comprises n-1 separate cells, each of said cells having first and second shift elements, in said first shift elements are serially interconnected together to form a first leg of a shift register and said second shift elements are serially interconnected together to form a second leg of a shift register, and said input pulses are applied as input to a first end of said first leg, a central cell, having a shift element and connected to said first and second legs, wherein the central cell shift element receives, as input thereto, bits shifted out from a second end of said first leg and applies, to an input of said second leg and to a central cell output lead, bits shifted out of said central cell, and a logic circuit, associated with each of a plurality of said n-1 cells to form a corresponding plurality of "active" cells, wherein each of said logic circuits is connected to the output of the first and second shift elements located in a respective cell and to said central cell output lead and provides an associated one of said "hit" output leads, and wherein each logic circuit detects the occurrence of a triplet pulse comprising separate pulses having a predetermined group pulse repetition interval and appearing in said first and second shift elements in the respective cell and on said central cell output lead 2. The system in claim 1 wherein the plurality of "active" cells is comprised of n-m serially connected "active" cells, where m is an integer and lies within the range of $0 < m \leq n$.

3. The system in claim 2 wherein at least an ith one of said "active" cells further comprises means, serially interconnected between the output of the second shift element in said ith cell and the input to the second shift element in an i+1st one of said "active" cells and operates in response to a triplet pulse detected by said logic circuit, for inhibiting the input pulse appearing, at the output of the second shift element and which formed part of a triplet pulse, from propagating from the ith cell through said second leg to the second shift element in the i+1st cell.

4. The system in claim 3 wherein each of the "active" cells further comprises said inhibiting means and all of said inhibiting means are substantially identical.

5. The system in claim 4 wherein each logic circuit further comprises means, responsive to each triplet pulse detected therein, for gating one of said input pulses which formed part of that triplet pulse to the associated "hit" output lead.

6. The system in claim 5 wherein the logic circuit further comprises means for ascertaining an interval of time occurring between successive triplet pulses detected by said logic circuit.

7. The system in claim 6 wherein the ascertaining means comprises a counter which counts the number of clock intervals occurring between said successive triplet pulses and provides an output value indicative of said count, whereby the output value represents the inter-pulse pulse repetition interval for the input pulse substantially simultaneously appearing on the associated "hit" output lead.

8. The system in claim 5 wherein the logic circuit further comprises means for detecting the occurrence of both a triplet pulse and at least one additional condition before gating one of the input pulses to the associated "hit" output lead.

9. The system in claim 8 wherein the logic circuit further comprises a counter which is loaded with a predefined numerical value after the occurrence of each triplet pulse detected by that logic circuit, wherein the numerical value is then decremented at the occurrence of each successive clock interval occurring between the detection of that triplet pulse and an immediately subsequent triplet pulse, and wherein said additional condition is satisfied if said counter reaches a zero count substantially simultaneously with the occurrence of the subsequent triplet pulse.

10. The system in claim 7 wherein said de-interleaving means further comprises:
a third shift element associated with each of said n−1 cells and connected to the logic circuit associated with each "active" cell, wherein all of said third shift elements are serially interconnected to form a separate shift register, and wherein, in response to the detection of a triplet pulse within any "active" cell, a pulse is provided as input to the third element associated with that "active" cell by the logic circuit associated therewith,
a third row output lead which receives the bits shifted out from an end of said separate shift register, and
wherein each of said associated logic circuits further comprises means, connected to said third row output lead and responsive to the occurrence of a triplet pulse and a pulse simultaneously occurring on the third row output lead, for gating one of the input pulses comprising said triplet pulse onto the associated "hit" output lead.

11. The system in claims 7, 9 or 10 wherein the de-interleaving means is further comprised of:
means, responsive to a pulse shifted out of said second end of the first leg, for extending the duration thereof by at least two clock intervals and for applying the resulting extended pulse to a half step output lead,
a first one of said logic circuits, associated with at least the ith one of said "active" cells, for detecting a first triplet pulse comprising separate pulses occurring on the outputs of said first and second shift elements located within said ith cell and on the central cell output lead,
a second one of said logic circuits, also associated with said ith cell, for detecting a second triplet pulse comprising separate pulses occurring at the output of said first shift element located within said ith cell, on said half step output lead and at the output of the second shift element located in the i+1st cell, wherein said first and second logic circuits are substantially identical.

12. The system in claim 11 wherein the first logic circuit further comprises means, responsive to said first triplet pulse, for providing one of the input pulses on the associated "hit" output lead; and said second logic circuit further comprises means, responsive to said second triplet pulse, for providing one of the input pulses comprising said second triplet pulse on another associated "hit" output lead, whereby the second logic circuit detects triplet pulses spaced at least ½ clock interval later than those detected by the first logic circuit so that the resolution of the de-interleaving means is effectively doubled without increasing the number of cells.

13. The system in claims 7, 9 or 10 wherein the de-interleaving means is further comprised of:
means, responsive to a pulse appearing at any one of various pre-defined locations in said first and second legs, for providing an extended pulse and for applying the extended pulse to a jittered output lead, a logic circuit, associated with at least the ith one of said "active" cells, for selectively detecting a non-jittered triplet pulse comprising separate pulses substantially simultaneously occurring on the outputs of said first and second shift elements located within said ith cell and on the central cell output lead, or a jittered triplet pulse comprising separate pulses occurring at the output of said first and second shift elements located within the ith cell and on the jittered output lead.

14. The system in claims 7, 9 or 10 wherein the de-interleaving means is further comprised of means for clocking all the shift elements comprising said second leg at least ½ clock intervals after all the shift elements for the first leg are clocked.

15. The system in claim 1 including:
identifying means, connected to said "hit" output leads, for separately analyzing the input pulses appearing on at least one of said "hit" output leads to discern any repetitive pattern existant therein and thereby partially identify the emitter which corresponds to the input pulses appearing on said one output.

16. The system in claim 7 including:
identifying means, connected to said "hit" output leads for separately analyzing the input pulses appearing on at least one of said "hit" output leads to discern any repetitive pattern existant therein and thereby partially identify the emitter which corresponds to the input pulses appearing on said one output.

17. The system in claims 15 or 16 wherein the identifying means comprises means for accumulating the input pulses appearing on at least an ith one of the associated "hit" output leads during a predetermined time interval.

18. The system in claim 17 wherein the accumulating means further comprises means for separately totalizing the input pulses appearing on the ith "hit" output lead and occurring at each different inter-pulse pulse repetition interval value that said ith one of the "active" cells is capable of resolving.

19. The system in claim 18 wherein the identifying means further comprises means, responsive to said totalized pulse counts and to a pulse descriptor word associated with at least one of the input pulses that comprise the discerned pattern, for identifying the emitter which transmitted a de-interleaved pulse train depicted by said pattern.

20. The system in claim 18 wherein the totalizing means further comprises a table for storing totalized pulse counts for each possible inter-pulse pulse repetition interval value that can be resolved by the ith cell.

21. The system in claim 20 wherein the identifying means further comprises means for generating a temporal histogram for the ith cell in response to the totalized pulse counts stored in the table associated with the ith cell.

22. The system in claim 21 wherein the identifying means further comprise means for analyzing the totalized pulse counts for at least the ith cell in order to discern any repetitive pattern existant therein.

23. The system in claim 22 wherein the identifying means further comprises at least one processor for totalizing the pulse counts for at least the ith cell and another processor for analyzing the totalized pulse counts for at least the ith cell.

24. The system in claim 23 wherein the identifying means further comprises means, responsive to said totalized pulse counts and to a pulse descriptor word associated with at least one of the input pulses that comprise the discerned pattern, for identifying the emitter which transmitted a de-interleaved pulse train depicted by said pattern.

25. In a system for de-interleaving an input signal, having successively occurring input pulses, into a plurality of constituent pulse trains and for identifying at least one emitter that produced an associated one of said constituent pulse trains, wherein the improvement comprises:

de-interleaving means, responsive to said input signal, for determining the pulse repetition interval of each of said input pulses, and for routing each of said input pulses to a respective one of a plurality of "hit" output leads, wherein each of said outputs corresponds to a different group pulse repetition interval, wherein said de-interleaving means comprises:

$n-1$ separate cells, each of said cells having first and second shift elements, said first shift elements are serially interconnected together to form a first leg of a shift register and said second shift elements are serially interconnected together to form a second leg of a shift register, and said input pulses are applied as input to a first end of said first leg, a central cell, having a shift element and connected to said first and second legs, wherein the central cell shift element receives, as input thereto, bits shifted out from a second end of said first leg and applies, to an input of said second leg and to a central cell output lead, bits shifted out of said central cell, and a substantially identical logic circuit, associated with n-m of said $n-1$ cells (where m is an integer within the range of $0 < m \leq n$) to form n-m "active" cells, wherein each of said logic circuits is connected to the output of the first and second shift elements located in a respective "active" cell and to said central cell output lead and provides an associated one of said "hit" output leads, and wherein each logic circuit detects the occurrence of a triplet pulse having a pre-determined group pulse repetition interval and comprising separate pulses appearing in said first and second shift elements in the respective "active" cell and on said central cell output lead; and identifying means, connected to said "hit" output leads, for separately analyzing the input pulses appearing on at least one of said "hit" output leads to discern any repetitive pattern existant therein and thereby partially identify the emitter corresponding to the input pulses appearing on said one output, wherein said identifying means comprises means for accumulating the input pulses appearing on at least an ith one of the associated "hit" output leads during a pre-determined time interval.

26. The system in claim 25 wherein each of the "active" cells further comprises means, serially interconnected between the output of the second shift element in the ith cell and the input to the second shift element in the i+1st cell and operates in response to a triplet pulse detected by said logic circuit, for inhibiting the input pulse appearing, at the output of the second shift element and which formed part of a triplet pulse, from propagating from said ith cell through said second leg to the second shift element in the i+1st cell.

27. The system in claim 26 wherein each logic circuit further comprises means, responsive to each triplet pulse detected therein, for gating one of said input pulses which formed part of that triplet pulse to the associated "hit" output lead.

28. The system in claim 27 wherein the logic circuit further comprises means for ascertaining an interval of time occurring between successive triplet pulses detected by said logic circuit.

29. The system in claim 28 wherein the ascertaining means comprises a counter which counts the number of clock intervals occurring between said successive triplet pulses and provides an output value indicative of said count, whereby the output value represents the interpulse pulse repetition interval for the input pulse substantially simultaneously appearing on the associated "hit" output lead.

30. The system in claim 29 wherein the de-interleaving means is further comprised of:

a third shift element associated with each of said $n-1$ cells and connected to the logic circuit associated with each "active" cell, wherein all of said third shift elements are serially interconnected to form a separate shift register, and wherein, in response to the detection of a triplet pulse within any "active" cell, a pulse is provided as input to the third element associated with that "active" cell by the logic circuit associated therewith, a third row output lead which receives the bits shifted out from an end of said separate shift register, and wherein each of said associated logic circuits futher comprises means, connected to said third row output lead and responsive to the occurrence of a triplet pulse and a pulse simultaneously occurring on the third row output lead, for gating one of the input pulses comprising said triplet pulse onto the associated "hit" output lead.

31. The system in claims 29 or 30 wherein the de-interleaving means is further comprised of:

means, responsive to a pulse shifted out of said second end of the first leg, for extending the duration thereof by at least two clock intervals and for applying the resulting extending pulse to a half step output lead, a first one of said logic circuits, associated with at least the ith one of said "active" cells, for detecting a first triplet pulse comprising separate pulses occurring on the outputs of said first and second shift elements located within said ith cell and on the central cell output lead, a second one of said logic circuits, also associated with said ith cell, for detecting a second triplet pulse comprising separate pulses occurring at the output of said first shift element located within said ith cell, on said half step output lead and at the output of the second shift element located in the i+1st cell, wherein said first and second logic circuits are substantially identical.

32. The system in claims 29 or 30 wherein the de-interleaving means is further comprised of:

means, responsive to a pulse appearing at any one of various pre-defined locations in said first and second legs, for providing an extended pulse and for applying the extended pulse to a jittered output lead, a logic circuit, associated with at least the ith one of said "active" cells, for selectively detecting a non-jittered triplet pulse comprising separate pulses occurring on the outputs of said first and second shift elements located within said ith cell and on the central cell output lead, or a jittered triplet pulse comprising separate pulses occurring at the output of said first and second shift elements located within the ith cell and on the jittered output lead.

33. The system in claim 25 wherein the accumulating means further comprises:
means for separately totalizing the input pulses appearing on the ith "hit" output lead and occurring at each different inter-pulse pulse repetition interval value said ith cell is capable of resolving, and
a table for storing totalized pulse counts for each of said different inter-pulse pulse repetition intervals.

34. The system in claim 33 wherein the identifying means further comprises means for generating a temporal histogram for the ith cell in response to the totalized pulse counts stored in the table associated with the ith cell.

35. The system in claims 33 or 34 wherein the identifying means further comprises:
means, for analyzing the totalized pulse counts for at least the ith cell in order to discern any repetitive pattern existant therein, and
means, responsive to each discerned pattern and to a pulse descriptor word associated with at least one of the detected pulses that comprise the discerned pattern, for identifying the emitter which transmitted a de-interleaved pulse train depicted by said pattern.

36. A method for use in a system for de-interleaving an input signal, having successively occurring input pulses, into a plurality of constituent pulse trains and for identifying at least one emitter that produced an associated one of said contituent pulse trains, wherein the method comprises:
a de-interleaving step wherein the pulse repetition interval of each of said pulses in said input signal is determined and each of said pulses in said input signal is determined and each of said input pulses is routed to a respective one of a plurality of "hit" outputs, wherein each of said "hit" outputs corresponds to a different group pulse repetition interval, and wherein said de-interleaving step includes the steps of:
forming n−1 separate cells, wherein each of said cells contains at least first and second shift elements,
linking said first shift elements together for form a first leg of a shift register,
linking said second shift elements together to form a second leg of a shift register,
applying said input pulses as input to a first end of said first leg,
forming a central cell, having a shift element linked to said first and second legs,
applying bits shifted out from a second end of said first leg to an input of the central cell shift element,
routing bits shifted out of aid central cell shift element both to an input of said second leg and to a central cell output, and
detecting, in response to the output of the first and second shift elements located in a respective cell and to input pulses appearing on said central cell output, the occurrence of a triplet pulse having a pre-determined group pulse repetition interval and comprising separate pulses appearing at the outputs of said first and second shift elements in the respective cell and on said central cell output lead.

37. The method in claim 36 wherein the detecting step further includes the step of detecting triplets in only n-m serially aligned cells, where m is an integer within the range of $0 < m \leq n$, so as to form n-m "active" cells.

38. The method in claim 37 wherein the de-interleaving step further includes the step of: inhibiting the input pulse appearing, at the output of the second shift element and which formed part of a triplet pulse, from propagating from an ith one of said "active" cells through said second leg to the second shift element in an i+1st one of said n−1 cells.

39. The method in claim 38 wherein the detecting step includes the step of gating, in response to each detected triplet pulse, one of the input pulses which formed part of the detected triplet pulse to the associated "hit" output.

40. The method in claim 39 wherein the detecting step includes the step of ascertaining an interval of time occurring between successive detected triplet pulses.

41. The method in claim 40 wherein the ascertaining step includes the steps of counting the number of clock intervals occurring between said successive triplet pulses and providing an output value indicative of said count, whereby the output value represents the inter-pulse pulse repetition interval for the input pulse substantially simultaneously appearing on the associated "hit" output.

42. The method in claim 41 wherein the detecting step further includes the stpes of:
loading a counter with a pre-defined numerical value after the occurrence of each detected triplet pulse,
decrementing the numerical value at the occurrence of each successive clock interval occurring between the detection of that detected triplet pulse and a next subsequently detected triplet pulse, and
gating one of the input pulses which comprises the detected triplet pulse to the associated "hit" output if the counter reaches a zero count substantially simultaneously with the occurrence of the subsequently detected triplet pulse.

43. The method of claim 42 wherein said de-interleaving step includes the steps of:
forming a third shift element associated with each of aid n−1 cells,
linking said third shift elements together to form a separate shift register,
providing, in response to the detection of a triplet pulse within any cell, a pulse as input to the third element associated with that cell,
applying bits shifted out from an end of said separate shift register to a third row output lead, and
gating, in response to the occurrence of a triplet pulse and a pulse simultaneously occurring on the third row output lead, one of the input pulses comprising the detected triplet pulse onto the associated "hit" output.

44. The method in claim 43 wherein the de-interleaving step further includes the steps of:
extending the duration of any input pulse shifted out of the second end of the first leg by at least two clock intervals,
applying the resulting extedned pulse to a half step output, detecting a first triplet pulse comprising separate pulses occurring on the outputs of said first and second shift elements located within an ith one of said "active" cells and on the central cell output, providing, in response to the occurrence of the first triplet pulse, one of the input pulses comprising the first triplet pulse on the associated "hit" output, detecting a second triplet pulse comprising separate pulses occurring at the output of said first shift element located within said ith cell, on said half step output and at the output of the second shift element located in the i+1st cell, wherein said second triplet occurs at least ½ clock interval later than said first triplet pulse, and providing, in reponse to the occurrence of the second triplet pulse, one of the input pulses comprising the second triplet pulse on another associated "hit" output.

45. The method in claim 36 including:

an identifying step wherein the pulses appearing on at least one of said "hit" outputs is separately analyzed to discern any repetitive pattern existant there in order to partially identify the emitter which corresponds to the input pulses appearing on said one "hit" output.

46. The method in claim 40 including:

an identifying step wherein the pulses appearing on at least one of said "hit" outputs is separately analyzed to discern any repetitive pattern existant therein in order to partially identify the emitter which corresponds to the input pulses appearing on said one "hit" output.

47. The method in claims 41, 43 or 44 wherein the de-interleaving step includes the steps of:

providing, in response to a pulse appearing at any one of various pre-defined locations in said first and second legs, an extended pulse and for applying the extended pulse to a jittered output lead, selectively detecting a non-jittered triplet pulse comprising separate pulses occurring on the outputs of said first and second shift elements located within said ith cell and on the central cell output lead, or a jittered triplet pulse comprising separate pulses occurring at the output of said first and second shift elements located with in the ith cell and on the jittered output lead.

48. The method in claims 41, 43 or 44 wherein the de-interleaving step further includes the step of clocking all the shift elements comprising said second leg at least ½ clock intervals after all the shift elements for the first leg are clocked.

49. The method in claims 45 or 46 wherein the identifying step further includes the step of accumulating the input pulses appearing on at least an ith one of the associated "hit" outputs during a pre-determined time interval.

50. The method in claim 49 wherein the accumulating step further includes the steps of:

separately totalizing the input pulses appearing on the ith "hit" output and occurring at each different inter-pulse pulse repetition interval value that said ith one of the "active" cells is capable of resolving, and storing, in a table, the totalized pulse counts for each possible inter-pulse pulse repetition interval value that can be resolved by the ith cell.

51. The method in claim 48 wherein the identifying step further includes the steps of:

analyzing the totalized pulse counts for at least the ith cell in order to discern any repetitive pattern existant therein, and identifying, in response to each discerned pattern and to a pulse descriptor word associated with at least one of the input pulses that comprise the discerned pattern, the emitter which corresponds to a de-interleaved pulse train depicted by said pattern.

52. The method in claim 50 wherein the identifying step includes the step of generating a temporal histogram for the ith cell in response to the totalized pulse counts stored in the table associated with the ith cell.

53. The method in claim 52 wherein the identifying step further includes the steps of:

analyzing the totalized pulse counts for at least the ith cell in order to discern any repetitive pattern existant therein, and identifying, in response to each discerned pattern and to a pulse descriptor word associated with at least one of the input pulses that comprise the discerned pattern, the emitter which corresponds to a de-interleaved pulse train depicted by said pattern.

* * * * *